(12) United States Patent
Carr

(10) Patent No.: US 11,381,761 B2
(45) Date of Patent: Jul. 5, 2022

(54) PHONONICALLY-ENHANCED IMAGER (PEI) PIXEL

(71) Applicant: William N. Carr, Gainesville, FL (US)

(72) Inventor: William N. Carr, Gainesville, FL (US)

(*) Notice: Subject to any disclaimer, the term of this patent is extended or adjusted under 35 U.S.C. 154(b) by 0 days.

(21) Appl. No.: 17/538,506

(22) Filed: Nov. 30, 2021

(65) Prior Publication Data

US 2022/0174228 A1 Jun. 2, 2022

Related U.S. Application Data

(60) Provisional application No. 63/205,244, filed on Nov. 30, 2020.

(51) Int. Cl.
| | | |
|---|---|---|
| *G01J 5/20* | (2006.01) | |
| *H04N 5/33* | (2006.01) | |
| *H01L 27/146* | (2006.01) | |
| *H01L 27/16* | (2006.01) | |
| *H01L 35/02* | (2006.01) | |
| *H01L 35/28* | (2006.01) | |
| *G01J 5/02* | (2022.01) | |
| *G01J 5/00* | (2022.01) | |
| *G01J 5/12* | (2006.01) | |

(52) U.S. Cl.
CPC ............. *H04N 5/33* (2013.01); *G01J 5/023* (2013.01); *H01L 27/14603* (2013.01); *H01L 27/14669* (2013.01); *H01L 27/16* (2013.01); *H01L 35/02* (2013.01); *H01L 35/28* (2013.01); *G01J 2005/0077* (2013.01); *G01J 2005/123* (2013.01)

(58) Field of Classification Search
CPC .... H04N 5/33; G01J 5/023; G01J 2005/0077; G01J 2005/123; H01L 27/14603; H01L 27/14669; H01L 27/16; H01L 35/02; H01L 35/28
See application file for complete search history.

(56) References Cited

U.S. PATENT DOCUMENTS

| 5,471,515 A | 11/1995 | Fossum et al. |
| 6,346,459 B1 | 2/2002 | Usenko et al. |
| 7,854,991 B2 | 12/2010 | Hata et al. |

(Continued)

OTHER PUBLICATIONS

D. Kwan et al., "Recent trends in 8-14 um type II superlattice infrared detectors", Inftared Physics and Technology, Mar. 12, 2021, https://doi.org/10.1016/j.infrared.2021.103756, vol. 116, 103756.

(Continued)

*Primary Examiner* — Kiho Kim
(74) *Attorney, Agent, or Firm* — Kaplan Breyer Schwarz, LLP

(57) ABSTRACT

An imager pixel comprising a micro-platform supported by phononic nanowires, the nanowires providing an extreme-level of thermal isolation from a surrounding substrate. The micro-platform in embodiments comprises thermal sensors sensitive to heat from absorbed incident longwave/short-wave photonic irradiation. In embodiments, the pixel photonic sensing structure comprises both a thermal sensor together with a separate photodiode/phototransistor/photo-gate for sensing RGB and NIR wavelengths. Some embodiments comprise a micro-platform with an integral Peltier thermoelectric element permitting in situ refrigeration to cryogenic temperatures.

27 Claims, 24 Drawing Sheets

(56) References Cited

U.S. PATENT DOCUMENTS

| | | |
|---|---|---|
| 9,006,857 B1 | 4/2015 | Carr |
| 9,236,552 B2* | 1/2016 | Carr ..................... H01L 35/32 |
| 9,372,114 B2 | 6/2016 | Carr |
| 10,883,804 B2 | 1/2021 | Udrea et al. |
| 10,978,508 B2 | 4/2021 | Allen et al. |
| 2016/0240762 A1* | 8/2016 | Carr ..................... H01L 35/32 |

OTHER PUBLICATIONS

Dehzanghi et al., "Type II superlattices base visible/extended short-wavelength IR photodetectors with bandstructure-engineered photo-generated carrier extractor", Scientific Reports, Mar. 21, 2019, doi.org/10.1038/s41598-019-41494-6, 7 pp., vol. 9 5003.

G. Roelkens et al., "III-V-on-silicon photonic devices for optical communication and sensing", Photonics, dated 2015, doi: 10.10.3390/photonics2030969, pp. 969-1004, vol. 3.

Varpula et al., "Nano-thermoelectric infrared bolometers" APL Phononics, Mar. 23, 2021, doi: 10.1063/5.0040534,11 pp., vol. 6, 036111.

* cited by examiner

PHONONICALLY-ENHANCED IMAGER (PEI) PIXEL

STATEMENT OF RELATED CASES

Priority is claimed from U.S. Provisional Patent Application 63/205,244 filed Nov. 30, 2020.

BACKGROUND

Photonic sensor applications are often enhanced with sophisticated thermal packages providing thermal isolation with fabrication in pixelated formats. These sensor elements may be packaged as single pixels or in array formats, generally within a single sensor plane. Photonic sensor elements may be classified as "passive" when none or little external power is supplied to the basic sensor structure. Passive photonic sensing elements, so defined, include the bolometer, Seebeck thermoelectric, pyroelectric and pn junction semiconductor types. PN-junction types include photodiodes, photogates, and phototransistors. Photonic sensor pixelated elements that comprise CMOS signal conditioning circuits or Peltier thermoelectric cooling elements disposed within the sensor pixel are generally classified as "active".

Most photonic sensors structured as pixels for disposition within imaging arrays comprise signal conditioning circuits for reducing various forms of noise by providing a reduced source impedance or forms of switching to reduce noise from current flow and thermal fluctuations.

Photonic sensors generally comprise a semiconductor material either as a support structure or as the basic sensing structure. Cooled MCT diodes have provided the maximum spectral detectivity D* levels for many years. More recent developments of III-V materials with reduced energy bandgap layers have expanded the application space for infrared sensors wherein performance is increased for operation at both uncooled and reduced temperatures.

Desirable improvements needed in state-of-the-art for pixelated photonic sensors include increased detectivity D*, increased responsivity V/T or I/T, operation over increased temperature T ranges from cryo to heated levels, higher speed, lower manufacturing cost and reduced cost of ownership.

Prior art relating to the present invention includes the following US Patents and technical publications:

E. R. Fossum et al, "Active pixel sensor with intra-pixel chare transfer", U.S. Pat. No. 5,471,515 issued Nov. 28, 1995. disclosing a CMOS imaging pixel comprising a photogate with CCD charge transfer for readout and a double sampling circuit.

Usenko and W. Carr, "Process for lift off and transfer of semiconductor devices onto an alien substrate" U.S. Pat. No. 6,346,459 issued Feb. 12, 2002.

K. Hata et al, "Single-walled carbon nanotube and aligned single-walled carbon nanotube bulk structure, and their production process, production apparatus and application use, U.S. Pat. No. 7,854,991 issued Dec. 21, 2010.

W. Carr, "Platform comprising an infrared sensor" U.S. Pat. No. 9,006,857 issued Apr. 14, 2015 discloses a sensor with phononic structured nanowires comprising a micro-platform wherein the pixel comprises a plurality of thermoelectric elements.

G. Roelkens et al, "III-V-on-silicon photonic devices for optical communication and sensing", Photonics, vol. 3, 969-1004 (2015); doi: 10.10.3390/photonics2030969 discloses several packaging options for mounting III-V semiconductor devices on silicon platforms.

Dehzanghi et al, "Type II superlattices base visible/extended short-wavelength IR photodetectors with bandstructure-engineered photo-generated carrier extractor" Scientific Reports, vol 9, 5003 (2019); doi.org/10.1038/s41598-019-41494-6 discloses a photonic sensor comprised of a pn heterojunction diode structured with InAs/AlSb/GaSb semiconducting layers.

D. Kwan et al, "Recent trends in 8-14 um type II superlattice infrared detectors", Infrared Physics and Technology, vol. 116, 103756 (2021) discloses additional structured detectors for LWIR sensing.

S. Allen et al, "Infrared detector having a directly bonded silicon substrate present on top thereof", U.S. Pat. No. 10,978,508 issued Apr. 13, 2021 discloses a direct bonding method for bonding of an infrared diode sensor onto a silicon substrate.

Varpula et al, "Nano-thermoelectric infrared bolometers" APL Phononics, vol. 6, 036111 (2021) doi: 10.1063/5.0040534 discloses an infrared bolometer comprising a Seebeck thermoelectric sensing element.

W. Carr, "Infrared spectrophotometer comprising an integrated Fabry-Perot Interferometer", U.S. Pat. No. 9,372,114 issued Jan. 21, 2016 discloses an infrared device comprising a substrate disposed within a cavity wherein infrared is reflected from an internal metallic reflector.

F. Udrea et al, "Infrared device" U.S. Pat. No. 10,883,804 issued Jan. 21, 2021 discloses an infrared device comprising a substrate disposed within a cavity wherein infrared is reflected from an internal metallic reflector.

SUMMARY OF THE INVENTION

The subject invention comprises a semiconductor pixel configured as a component for application within an imager. The pixel may be comprised of many different semiconductor materials, although a preferred embodiment is fabricated from a silicon silicon-on-insulator (SDI) starting wafer wherein a thermally-isolated micro-platform comprises one or more photonic sensing structures. These photonic sensing structures each provide a signal responsive to absorbed incident radiation within a broad wavelength range or selected limited wavelength bands within a visible (VIS) to millimeter (MM) wavelength range.

The phononically-enhanced infrared imager pixel (PEIP) comprises at least one micro-platform supported by nanowires disposed within a cavity and supported from a surrounding substrate. The phononic nanowires comprise a semiconductor layer wherein thermal conductivity is significantly reduced providing thermal isolation for the micro-platform. The micro-platform comprises at least one of several sensor types including thermal and pn junction types.

A photonic sensing structure within the pixel comprises (1) a thermal sensor having sensitivity to heating of the micro-platform from incident absorbed photonic radiation and (2) a pn junction sensor having sensitivity to hole-electrons currents created as the absorbed photonic radiation is absorbed. The thermal sensor types generally provide sensitivity to incident radiation over the near infrared (NIR)-millimeter (MM) wavelength range.

The pn junction sensor type disposed in the micro-platform can provide sensitivity to incident photonic radiation over the visible (VIS)-long wavelength infrared (LWIR) range depending on the bandgap, volume extent and temperature of absorbing semiconductor. The pn junction sensor types with heterojunctions having appropriate energy bandgap for photonic absorption and cooled within the pixel to cryogenic temperature can provide sensitivity within the VIS-LWIR range. Maximum detectivity D* is obtained with pn-junction sensors comprising type II superlattice (T2SL) structures structured as either a photodiode (PD) or a phototransistor (PT). In an embodiment, the pixel comprises a first subpixel comprising the micro-platform and a second subpixel comprising a photonic sensor PD or PT disposed without the micro-platform.

In a preferred embodiment, the photonic sensing structure comprises a type II superlattice (T2SL) phototransistor (PT), wherein the multilayer diode comprises a heterojunction formed of semiconductors of at least two separate bandgaps, the PT structure providing an efficient sensor wherein hole and electron flow is controlled within the photonic structures. This embodiment is disclosed with a micro-platform supported with four nanowires, wherein two nanowires are connected to the phototransistor (PT) and the other two nanowires comprise a portion of a Peltier thermoelectric cooling device. This embodiment with the micro-platform structured for thermoelectric cooling provides a micro-refrigerator that can cool the micro-platform to cryogenic temperatures.

Embodiments comprising the Peltier thermoelectric (PTE) cooling structure are especially useful in reducing diffusion current noise within the photodiode (PD) and phototransistor (PT)-based pixels. The Peltier thermoelectric (PTE) cooling structure is moderately useful reducing thermal kTR noise in pixel embodiments comprising a thermal photonic sensor.

In all embodiments, the nanowires provide a maximum thermal isolation for the photonic sensor disposed on the micro-platform. For example, a supporting silicon thin film nanowire comprising a phononic crystal can provide a decrease in thermal conductivity of over two orders of magnitude compared with bulk silicon semiconductor.

The PEIP pixel in embodiments comprises CMOS circuitry of varying complexity. In an embodiment, the pixel comprises a correlated double sampling (CDS) circuit that reduces pixel-generated noise provided in the output signal from the pixel.

In imager application embodiments, the PEIP is structured in plurality within an array format to provide sensitivity within one or more wavelength bands including VIS to MM wavelengths wherein at least one micro-platform comprises phononically-enhanced structure.

DETAILED DESCRIPTION OF THE INVENTION

Definitions

Figure 1A:
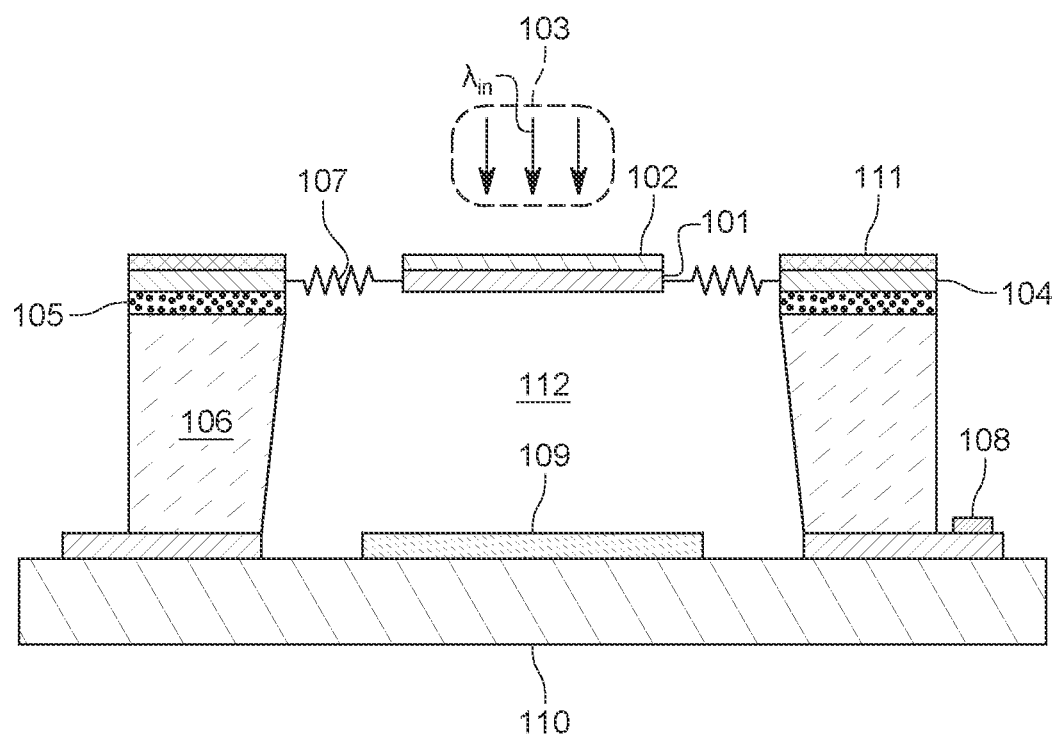
FIG. 1A and FIG. 1B depict simplified cross-sectional views of the PEIP with a micro-platform supported by nanowires suspended from a surrounding substrate.

"micro-platform" means a platform having dimensions having a footprint ranging from a few microns upward to centimeter. The platform is free standing and suspended by nanowires.

"nanowire" means the thin film suspension for the micro-platform and having an anchor into the surrounding platform. The nanowire has a thickness of at least 10 nanometers and a width of at least 100 nanometers.

"photonic sensing structure" means a structural element providing a voltage or current in response to absorbed incident radiation within the wavelength range VIS to millimeter MM wavelengths.

"thermocouple" means a thermoelectric device used to either measure temperature of the micro-platform or to cool the micro-platform based on the Seebeck effect and Peltier thermoelectric effects, respectively. The thermoelectric device comprises both the supporting semiconductor nanowires and an on-platform couple wherein the difference between the micro-platform temperature and the surrounding platform is sensed in the Seebeck effect as a voltage. The micro-platform temperature is cooled with respect to the surrounding platform in the Peltier effect driven from an external electrical power source.

"Seebeck thermoelectric (STE) means a thermoelectric device having at least 2 wires connected with one end terminating into a surrounding substrate maintained at a reference temperature, and the other ends connected to each other within the micro-platform. The STE sensor provides a voltage signal proportional to the difference of temperature between the surrounding substrate and the micro-platform.

"Peltier thermoelectric (PTE) cooler" is the reverse analog of the STE sensor wherein a reference voltage (RV) is provided externally and the device junction within the micro-platform provides cooling power proportional to the external RV.

"bolometer thermistor (BT) sensor" means a passive thermal sensor comprising a thin film that changes electrical resistance with temperature. Readout from the sensor is obtained by measuring the magnitude of a sensed current or voltage established through the bolometer thermistor device.

"pyroelectric (PE) sensor" means a passive thermal sensor of semiconductor having crystalline symmetry comprising a single polar axis wherein a transient electric charge builds up perpendicular to the polar axis as a temperature differential occurs due to absorbed incident radiation. This sensor is often used with incident radiation sources that are switched on and off.

"pn junction photonic sensor" is a semiconductor photonic sensing device comprising a photodiode (PD) or a phototransistor (PT). The pn-junction photonic sensor can be a "monojunction" comprising a pn junction of a single semiconductor material, such as silicon, InAs, GaSb, InSb or a "heterojunction" comprising a diode with the n- and p-type regions of different materials such as InAs, InAlAs. GaSb, or a heterojunction type II semiconductor super lattice.

"superlattice detector" is a photon sensor comprising a heterostructured photodiode (PD) or heterostructured phototransistor (PT) structured with multiple layers of semiconductor materials having different energy bandgaps wherein electrons and holes are essentially separated, and wherein the layers provide transparency and absorption for selected wavelengths.

"type II superlattice" refers to a photodiode (PD) or phototransistor (PT) comprising a specific type of semiconductor lattice wherein specific semiconductor layers provide interband tunneling and a barrier for electrons and/or holes generated by absorbed incident photonic radiation.

"RGB photonic structure" refers to a sensor comprising a pn junction photodiode (PD), pn junction phototransistor (PT) or photogate (PG) further comprised of a single type of semiconductor such as silicon providing sensitivity to one or more of red, green and blue (RGB) wavelength bands.

Micro-Platform and Supporting Nanowire Structure

Figure 1B:
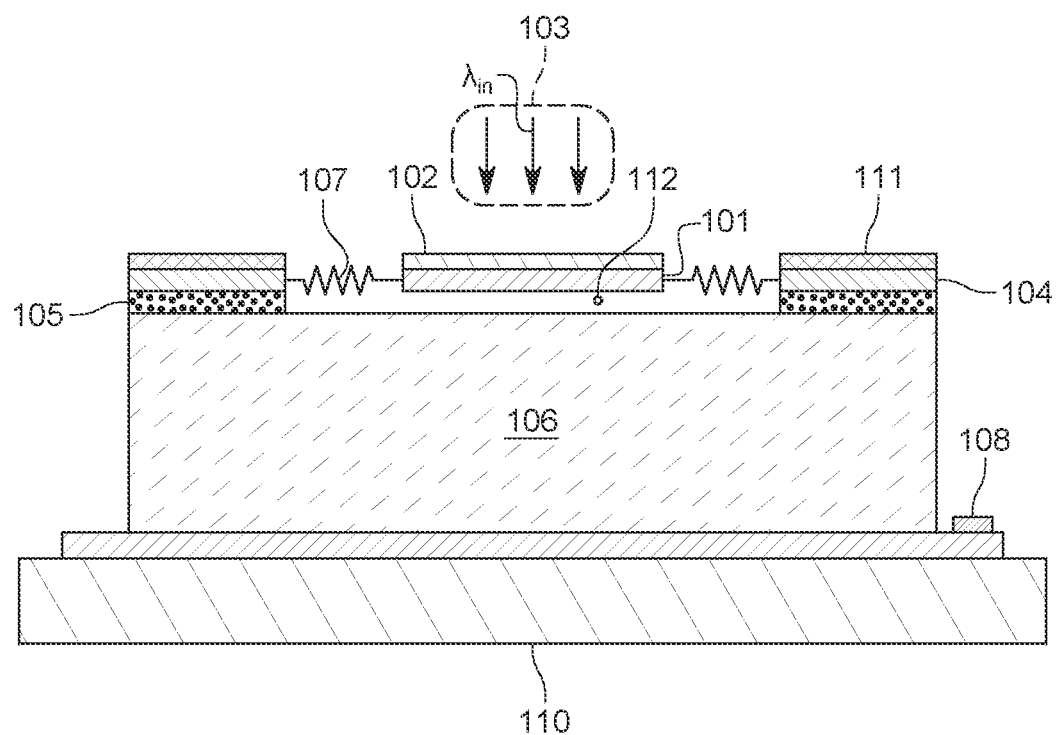
Figure 2:
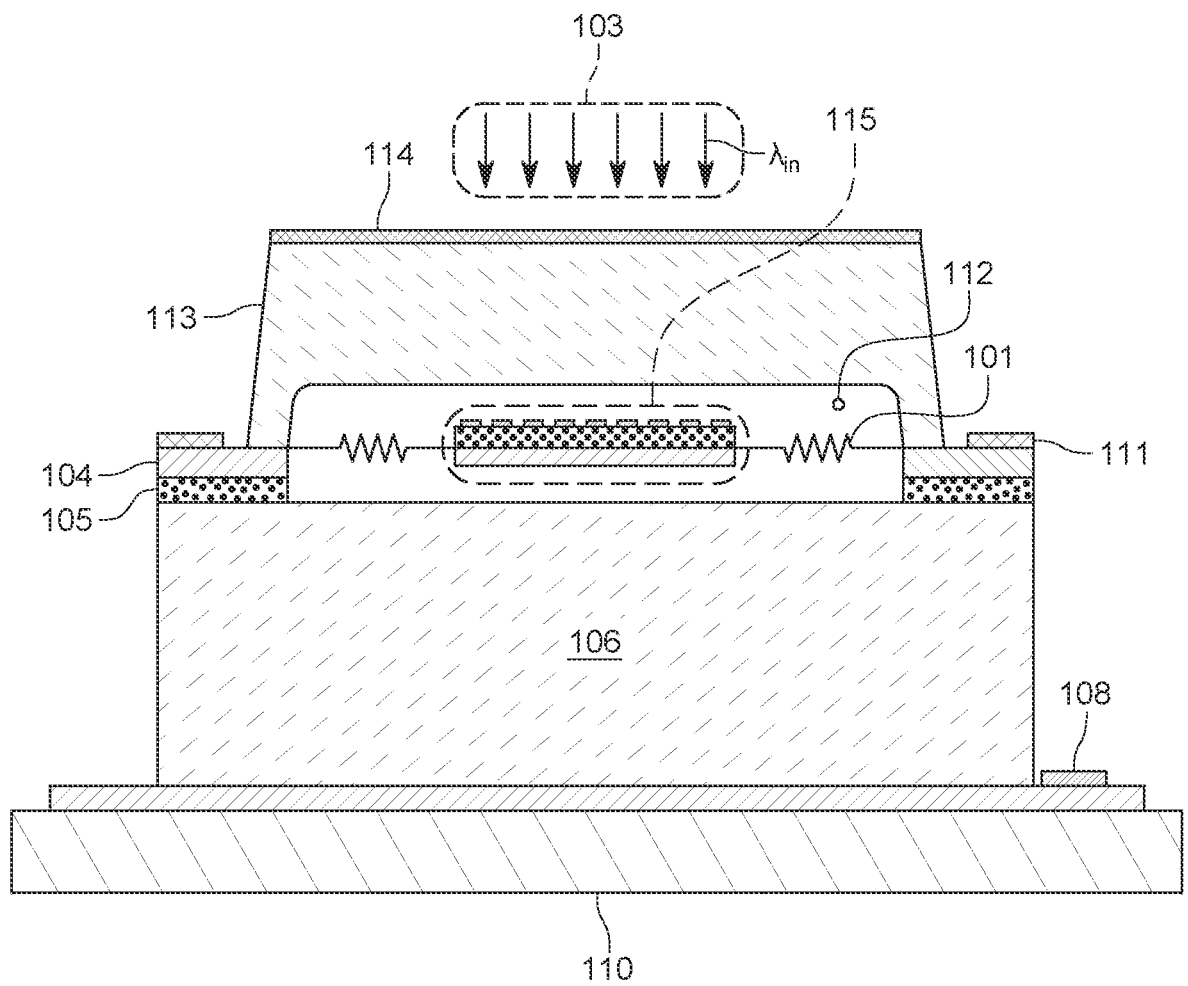
FIG. 2 depicts a simplified cross-sectional view of the PEIP with bonded second substrate.
Figure 3:
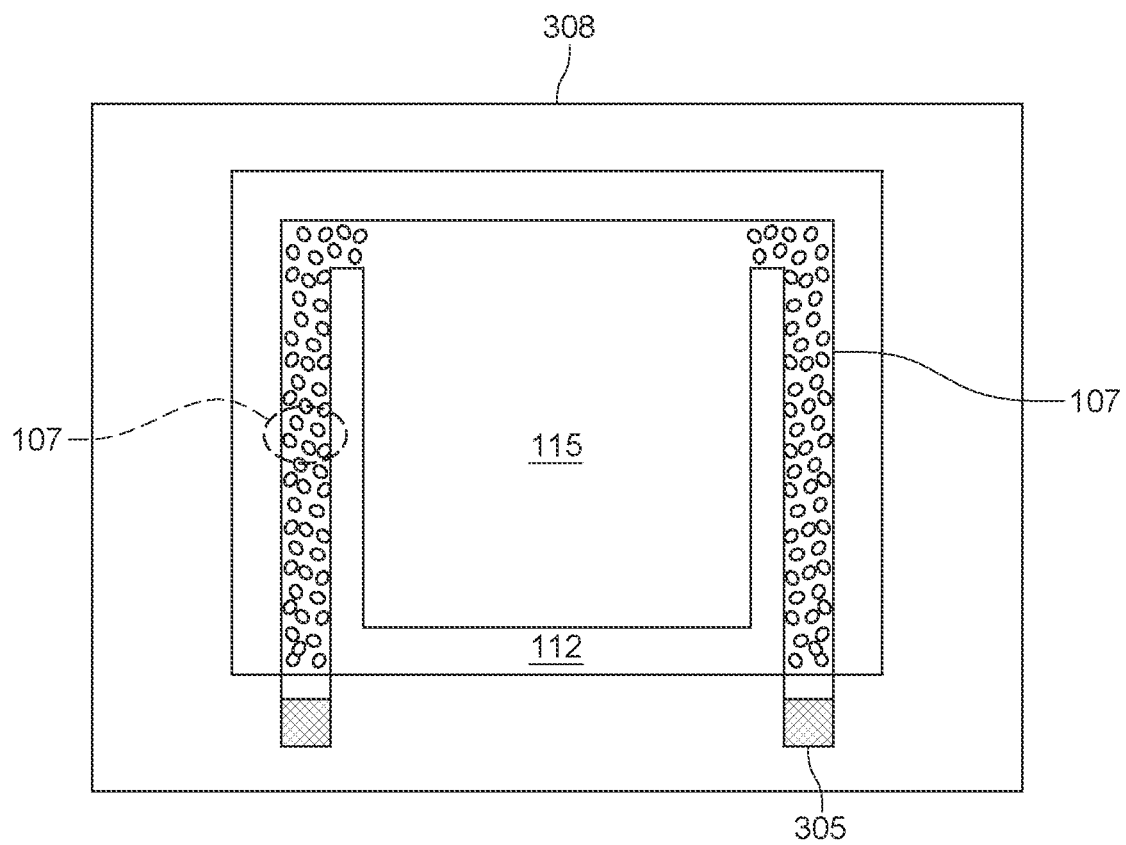
FIG. 3 depicts a plan view of a PEIP embodiment comprising nanowires and micro-platform.

FIGS. 1A, 1B, and 2 depict cross sectional views, and FIG. 3 depicts a plan view of a micro-platform supported by nanowires 107 within the pixel. Incident radiation λin within the VIS-MM wavelength range is absorbed into micro-platform depicted as 115 (FIG. 2). In these Figures, micro-platforms 101,115 formed from the active region of an SOI starting wafer with a buried oxide (BOX) layer 105 and surrounding first substrate 106, is processed to include a cavity 112. In embodiments, the cavity is formed using a backside release etch in FIG. 1A, and using a bottomside release etch in FIG. 1B. In FIG. 3 the cavity 112 is extended upward in volume with an additional bonded topside etch into topside substrate 114, the etch created prior to bonding of the topside substrate 113 onto bottomwide, surrounding substrate 106. Substrate 106 is bonded to substrate 110 comprising variously a ceramic header or a printed circuit board with electrical contact 108 and reflecting film 109. Radiation 103 is incident into the micro-platform 115 comprising active layer 102. Supporting nanowires 107 provide both electrical connection and thermal isolation of the micro-platform depicted as 115 comprising topside layer 102. In some embodiments, metallic film provides electrical contact to the nanowires. Micro-platform 104 is illustrated to be positioned below a layer 111.

In FIG. 2 the second substrate 113 is bonded to the topside of the first substrate creating a hermetic seal for cavity 112. The cavity 112 is maintained in an environment comprising a vacuum or gas of low thermal conductivity. The second substrate 113 provides a photonic transparent structure for incident radiation absorbed into the micro-platform structure 115. In embodiments, film 114 comprises a surface antireflective film for incident radiation 103 increasing overall pixel detectivity D*. The second substrate provides an optically transparent window comprised of, without limitation, one or more of Ge, Si, SiGe, ZnSe, CaF2, BaF2, MgF2, GaAs, KBr and glass.

In embodiments, metal film 109 of FIG. 1A provides a Fabry-Perot structure which in embodiments enhances the absorption of incident radiation into the micro-platform at resonant wavelengths. An example of this resonant structure is disclosed in the prior art U.S. Pat. No. 9,372,114 issued Jun. 21, 2016. In another embodiment FIG. 2, the micro-platform 115 comprises layers extending upward including absorptive films, photodiode (PD) and photo transistor (PT), and absorptive structures providing broadband absorption or absorption within a limited wavelength range. Incident infrared radiation 103 is absorbed into the micro-platform 115 through a topside sealed substrate 113.

Figure 4:
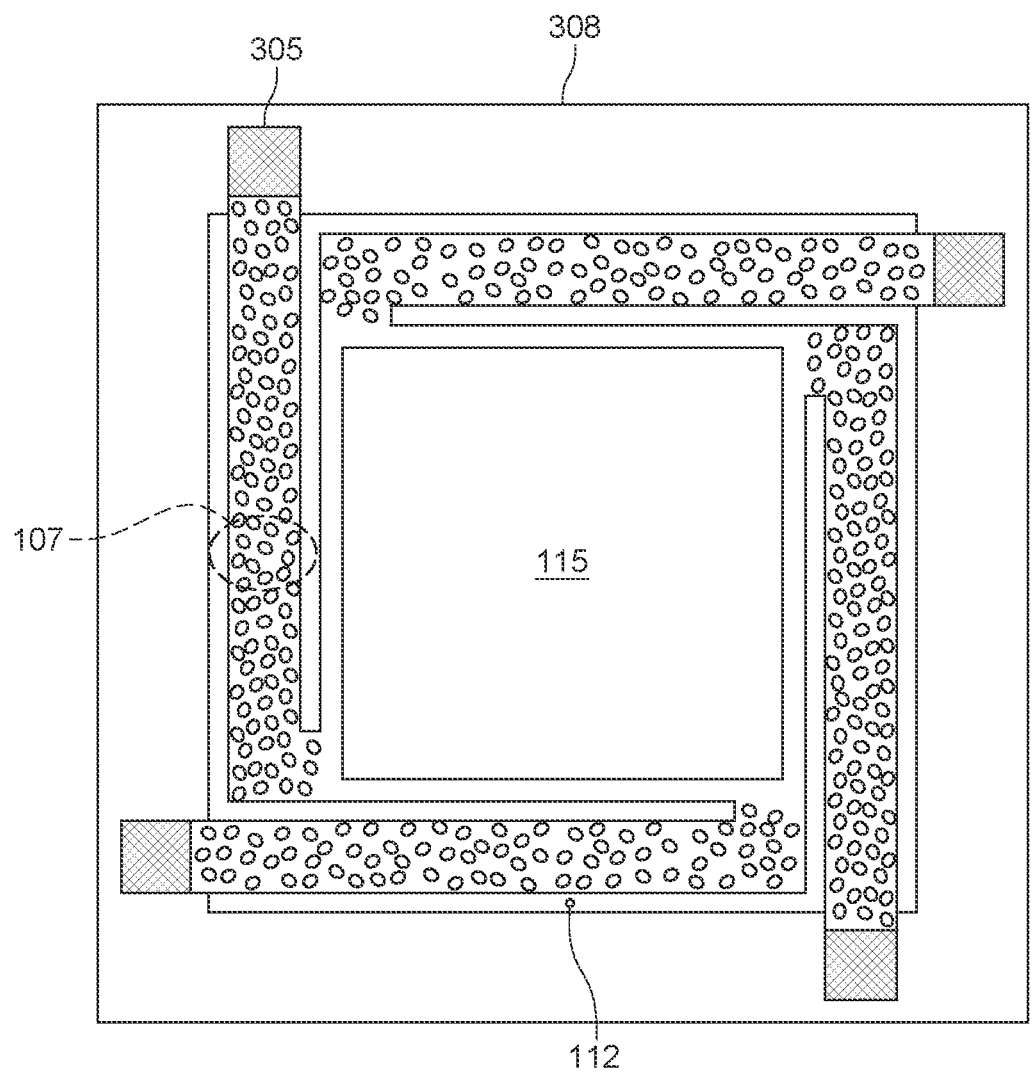
FIG. 4 depicts a plan view of a PEIP embodiment comprising nanowires and micro-platform.
Figure 5:
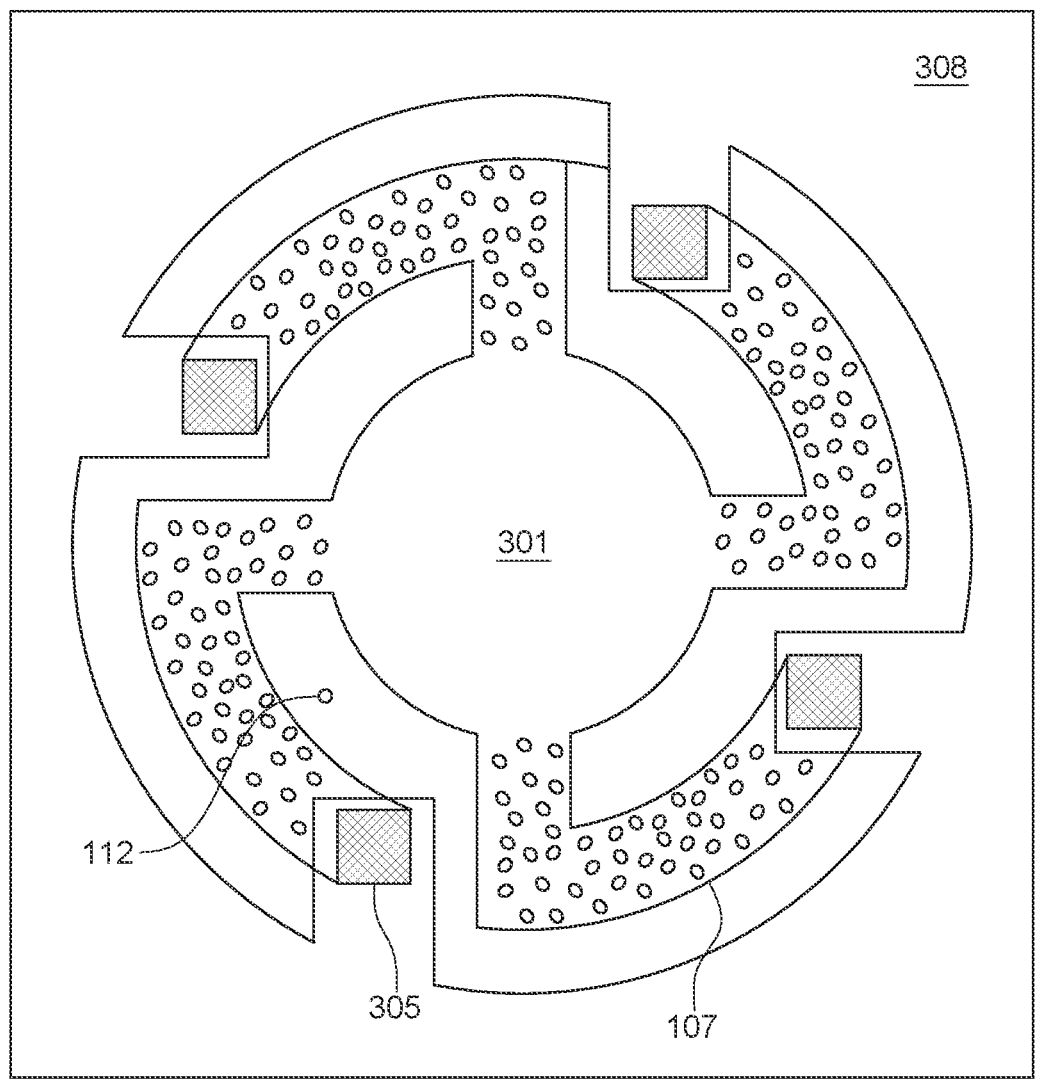
FIG. 5 depicts a plan view of a PEIP embodiment comprising nanowires and micro-platform.

FIGS. 3, 4, 5 and 6 depict plan views of the pixel micro-platform 115 in various configurations and with nanowires 107, disposed over cavity 112 and within surrounding platform 308. The nanowires with contacts 305 are anchored onto surrounding platform 308. The micro-platform 301 in FIGS. 3 and 4 is of rectangular shape providing maximum absorptive area per pixel area. The micro-platform 301 in FIG. 5 is supported by nanowires configured to reduce internal thermal stress for operation over a temperature range. The micro-platform 301 of FIG. 6 with multiple pairs of supporting nanowires is configured to provide maximum support and rigidity.

Figure 6:
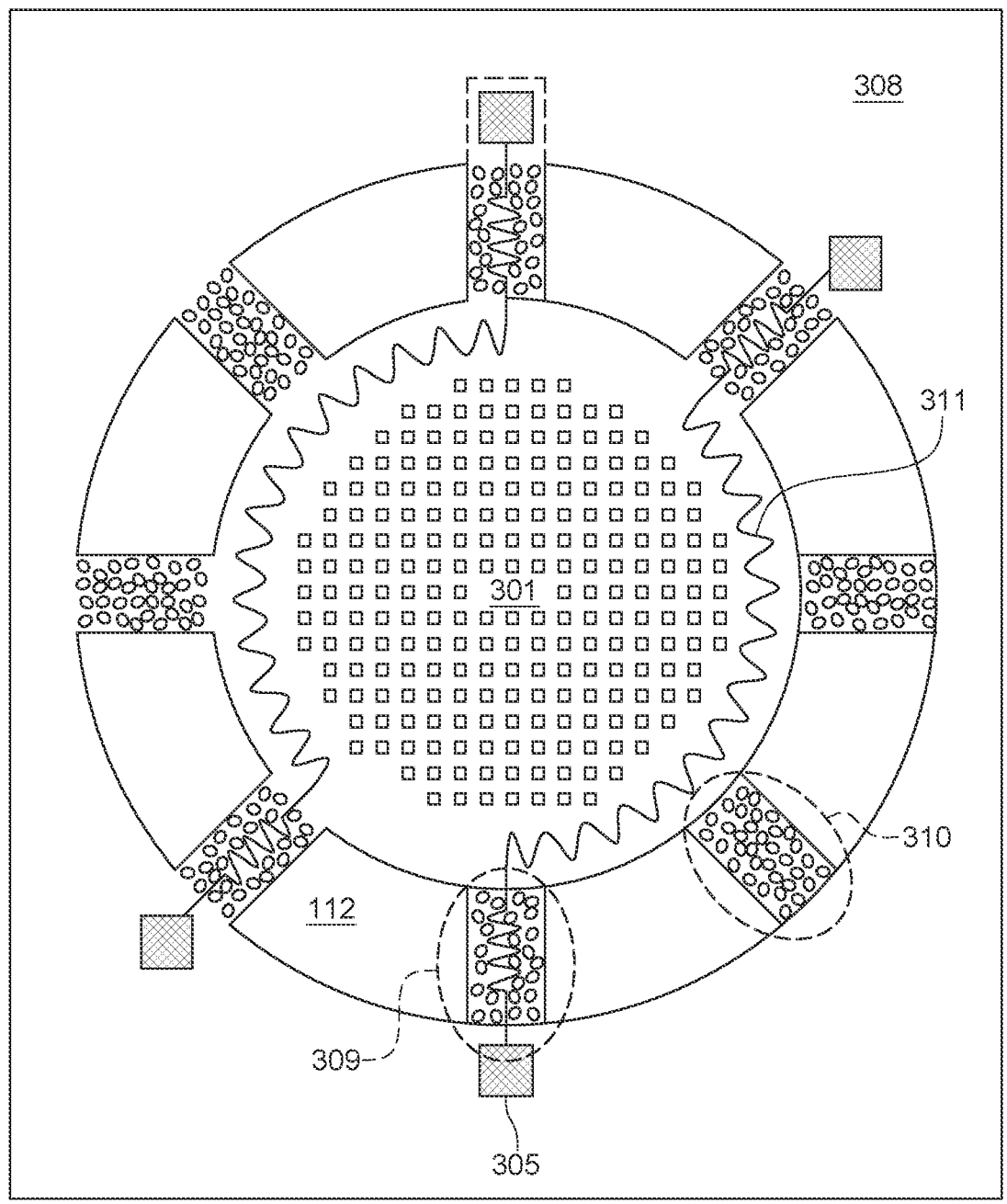
FIG. 6 depicts a plan view of a PEIP embodiment comprising nanowires and micro-platform.

FIG. 6 depicts an embodiment wherein the micro-platform 301 comprises an electric heater 311 having electrical connection through nanowires 309 into electrical contacts 305. Supporting nanowires 310 provide additional physical support for platform 301.

In the embodiment of FIG. 6, the micro-platform 301 is depicted as having plasmonic nanostructure enhancing absorption of incident radiation. In embodiments, the micro-platform 101, nanowires 107 formed from the active layer, buried oxide (BOX) layer providing the sacrificial layer for a cavity 112 and surrounding substrate 106 are created by processing a silicon SOI starting wafer. In other embodiments, the active semiconductor layer is a III-V or II-VI semiconductor layer bonded onto an oxidized silicon semiconductor wafer, wherein the semiconductor layer is obtained using a BESOI etching technology.

In all embodiments, one or more of the plurality of nanowires comprise a crystalline semiconductor having phononic structure limiting thermal conductivity. In all embodiments, the micro-platform comprises at least a portion of a photonic sensing structure supported by a plurality of nanowires, wherein the nanowires are physically coupled to a micro-platform and a surrounding first substrate. The nanowires suspend the micro-platform within a cavity.

In some embodiments, the pixel comprises a micro-platform with a first subpixel photonic sensing structure providing infrared sensitivity and a second subpixel photonic sensing structure comprised of a pn junction. The pn junction sensor is disposed on a separate micro-platform or directly into a substrate area extending the surrounding substrate. In all embodiments, any micro-platform comprising all or part of a photonic sensing structure may also comprise a Peltier thermoelectric (PTE) cooler. The PTE is powered through at least one of the plurality of nanowires suspending the micro-platform. In a preferred embodiment, a micro-platform comprising a photonic sensing structure and a PTE cooler is suspended by four nanowires, each nanowire having a phononic structure.

The pixel of claim 1 can be adapted with an additional micro-platform configured with an ohmic resistive heater and a gettering material, thereby providing a means of gettering undesirable gas leaked into the cavity comprising multiple micro-platforms.

Nanowires with First Layer Phononic Structure

Figure 7A:
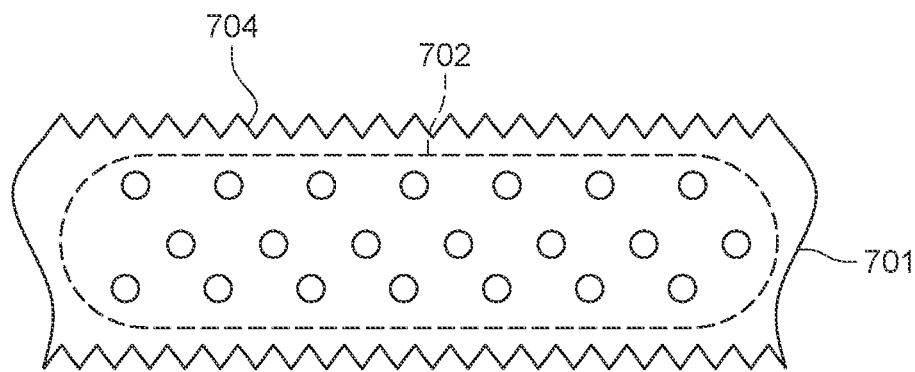
FIG. 7A depicts a plan view of a nanowire with phononic crystal structure and edge scalloping.

FIG. 7A is a plan view depicting a section 701 of a first layer of a semiconductor nanowire providing support for the micro-platform. FIG. 7A depicts a nanowire embodiment comprising a roughened surface 704 and an area structure 702, the area structure comprising a periodic arrangement of holes, indentations, pillars and other scattering sites. Periodic-array of phononic structure 702 comprises a phononic crystal (PnC) having a phononic bandgap which acts as barrier to heat conducting phonons moving along the nanowire length. The PnC is characterized with a phononic bandgap wherein phonons within phononic frequency bands are blocked.

Figure 7B:
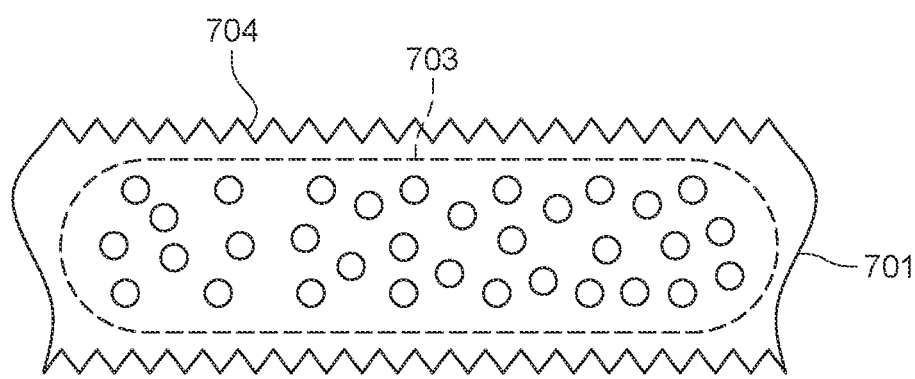
FIG. 7B depicts a plane view of a nanowire with non-resonant scattering sites and edge scalloping.

FIG. 7B depicts a plan view of a nanowire section 701 comprising randomly disposed phononic structure 703 wherein the separation between scattering sites is less than the mean free path (MFP) for heat conducting phonons. This phononic structuring may be disposed in the edges, in the bulk and in the edges of the nanowire. Randomly disposed scattering structures are effective in reducing thermal conductivity for the nanowire when the separation between scattering sites is less than the mean free path for heat conducting phonons. In prior art, phononic structure is disclosed for an infrared sensor in Carr, U.S. Pat. No. 9,006,857 issued Apr. 14, 2015.

Reduction of thermal conductivity in said first layer of the semiconductor nanowire may be significantly enhanced wherein the scattering sites are separated by less than the mean free path (MFP) for heat conducting phonons. The phononic layer as disclosed in this invention provides, in embodiments, a reduced thermal conductivity for the phononic layer near and beyond the Casimir limit.

In FIGS. 7A and 7B the phononic structure may comprise holes, vias, surface pillars, surface dots, plugs, cavities, indentations, surface particulate, roughened edges, implanted molecular species and molecular aggregates, wherein the phononic structure is disposed in a periodic or random format.

Phononic structuring of nanowires in FIGS. 7A and 7B increases the ratio of electrical conductivity to thermal conductivity for the nanowires providing a very desirable feature for most imager pixel applications.

Figure 8A:
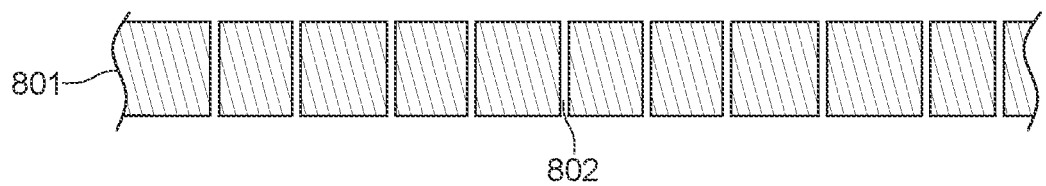
FIGS. 8A, 8B, and 8C depict a cross-sectional view of a phononic nanowire in embodiments.
Figure 8B:
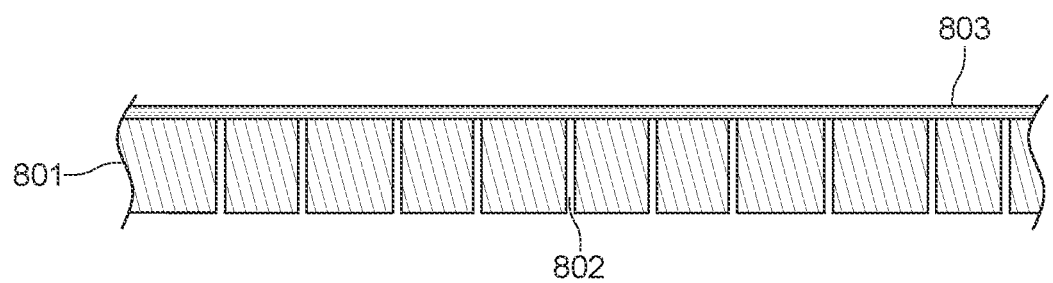
Figure 8C:
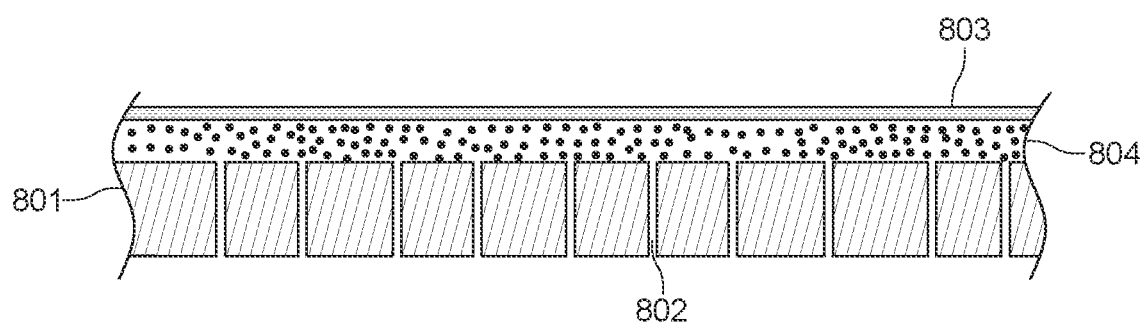

FIGS. 8A, 8B and 8C depict cross-sectional views of a supporting nanowire comprised of a first semiconductor layer 801 is illustrated with "holey" phononic crystal PnC structure 802. FIG. 8B depicts a nanowire with first layer 801 and a second layer of ALD metallic film 803 providing an increase in electrical conductivity for the nanowire.

FIG. 8C depicts a nanowire structured with a third layer 804 providing electrical isolation between the first semiconductor layer 801 and the ALD metallic film 803. Said third layer may comprise, without limitation, silicon dioxide, silicon nitride, hafnium oxide, graphene oxide, silicon oxynitride, aluminum oxide, PMMA and SU-8 providing electrical isolation and/or control of mechanical stress.

In a preferred embodiment, the pixel cavity is hermetically sealed and maintained in a vacuum or environment of low conductivity gas, permitting the micro-platform to spontaneously self-cool through blackbody broadband radiation emitted from the micro-platform. In this embodiment, design of the pixel with a transparent optical path for radiation exiting the micro-platform, micro-platform surfaces providing maximum emissivity, and a reflecting cavity surface underlying the micro-platform are desirable. In embodiments, each pixel cavity comprises multiple micro-platforms, wherein each micro-platform or group of micro-platforms is addressable through row and column address circuitry to provide an imager.

Photonic Absorptive and Filter Micro-Platform Structure

Figure 9A:
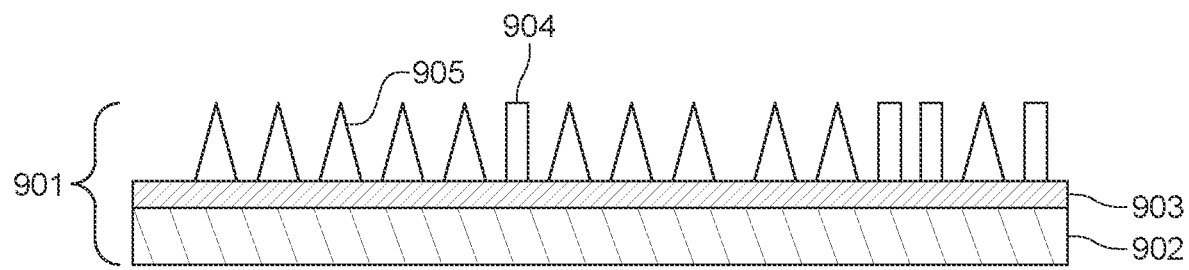
FIG. 9A depicts a cross-sectional view of the PEIP platform comprising vertical nanotubes and pillars.

FIGS. 9A, 9B, 9C and 9D depict cross-sectional views of micro-platform embodiments comprising several different photonic, absorptive structures which provide absorption or filtering of incident radiation entering the micro-platform. In FIG. 9A the micro-platform 901 comprises topside structure 904, 905 providing near perfect photonic absorption over a broad spectral range. In embodiments, the topside structure is grown or patterned over an ALD film 903. In embodiments, the structure depicted in FIG. 9A comprises, without limitation, one or more of a field of nanotubes including carbon nanotubes, bonded graphene, TiW, TiN, polycrystalline semiconductor particles, gold black, silicon black and a field of structured pillars enhancing absorption of the incident radiation over a broadband wavelength range.

Figure 9B:
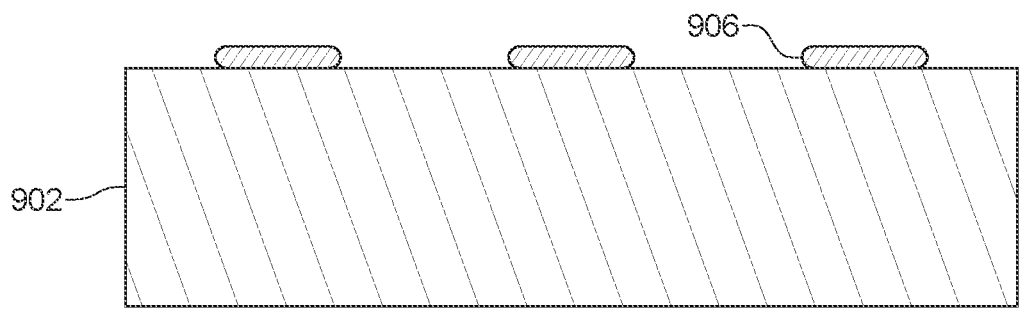
FIGS. 9B, 9C, and 9D depict a cross-sectional view of the PEIP micro-platform comprising resonant thin film surface structure.
Figure 9C:
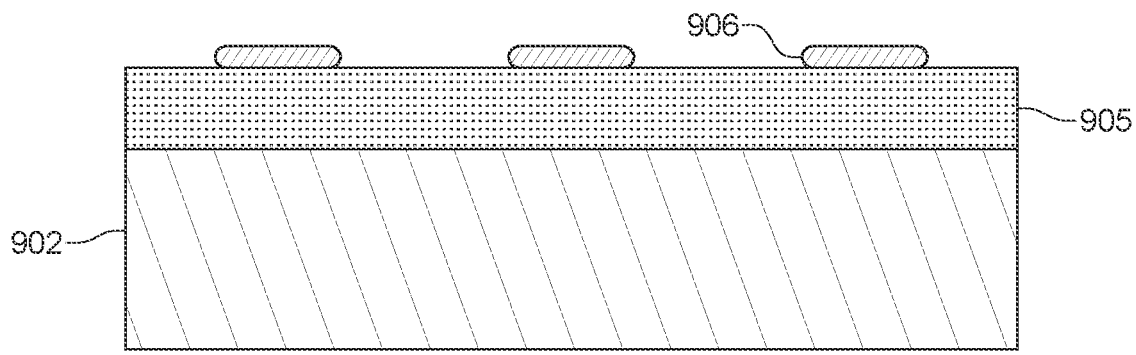
Figure 9D:
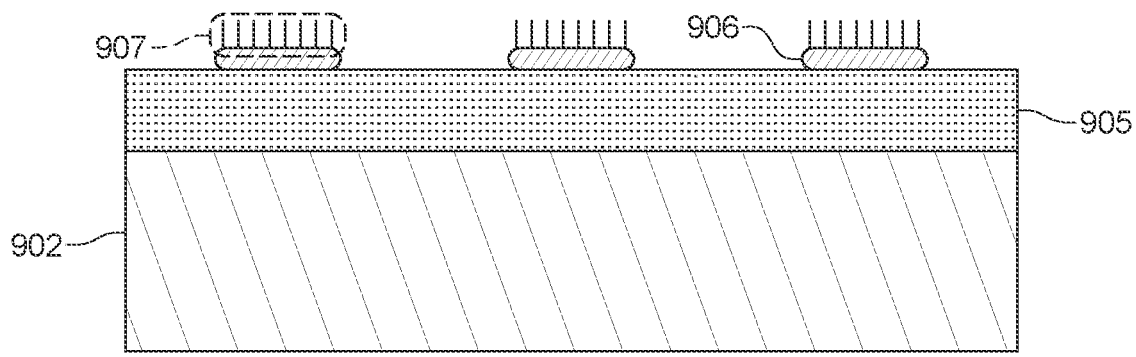

FIG. 9B depicts the micro-platform 902 comprising a single layer of patterned conducting or semiconducting thin film structure 906, wherein discrete LC and/or plasmonic resonance structure provides absorption or filtering of incident radiation over a limited wavelength range. FIG. 9C depicts structure 906 with a dielectric underlying layer 905 of one or more of SiO2, SiN, SiOxNy, HfO2 and TiN providing electromagnetic isolation for structures 906. FIG. 9D depicts a platform structure comprising film structure 906 with additional broadband thermal absorption provided by nanotubes 907 over patterned metallic film 906.

FIGS. 10A-10H and FIGS. 11A-11G depict plan views of specific patterned surface metallic films disposed in the micro-platform as in FIGS. 9B and 9C. These photonic structures are resonant at frequencies within spectral wavelengths of interest for the pixel providing an increase in absorptivity for thermal sensing within these spectral wavelengths.

Figure 10A:
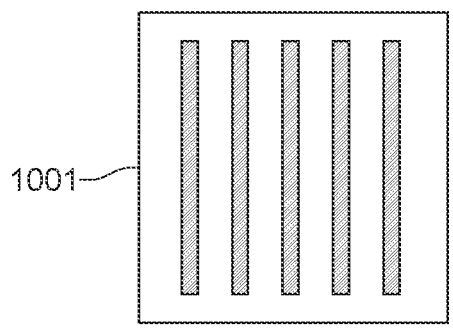
FIGS. 10A-10H depict plan views of PEIP micro-platforms with resonant structures increasing absorptivity within one or more wavelength bands.
Figure 10B:
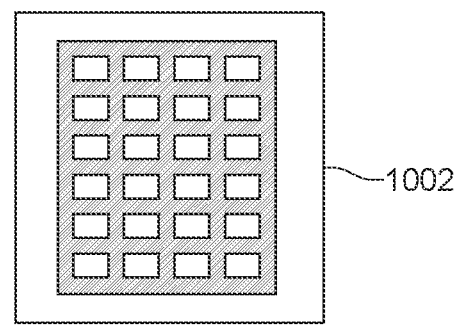
Figure 10C:
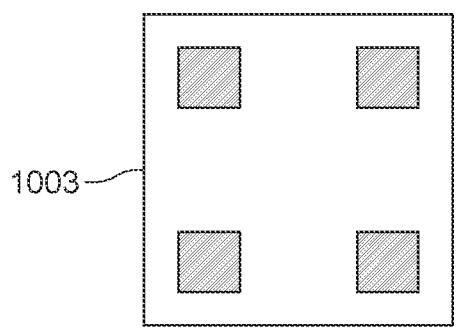
Figure 10D:
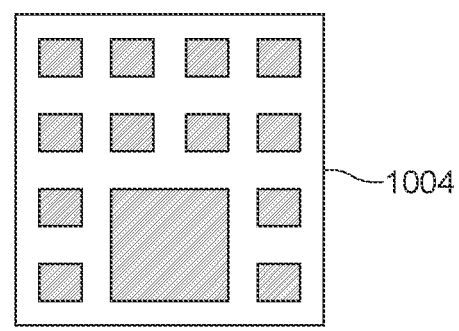
Figure 10E:
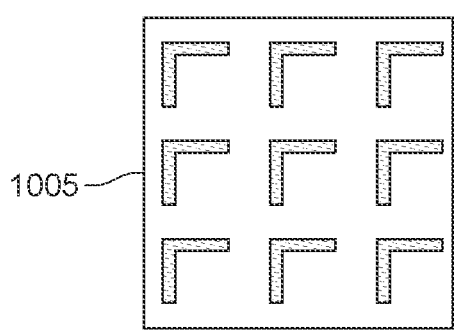
Figure 10F:
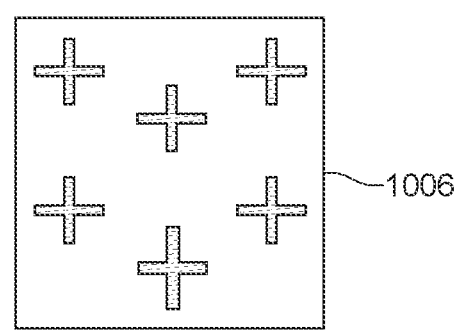
Figure 10G:
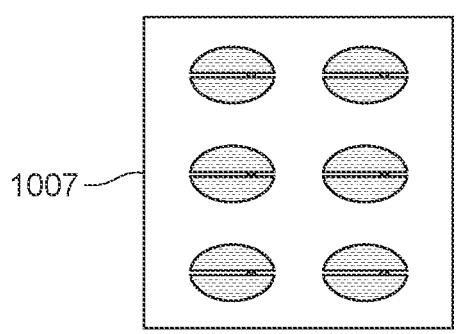
Figure 10H:
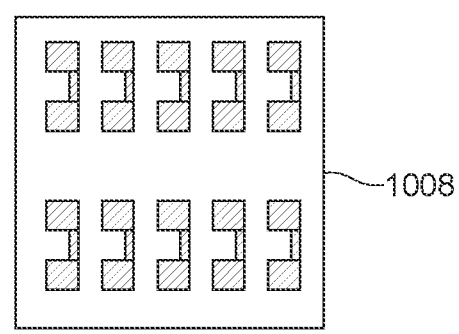

FIG. 10A discloses Bragg absorber 1001 comprising a 1-D grating sensitive to a polarization component of incident radiation corresponding to the resonance of the Bragg structure. In FIG. 10B, resonant structure provides a 2-D absorber 1002 for incident wavelength within a limited range and is polarization sensitive. Embodiments, FIGS. 10C-10H may comprise plasmonic and non-plasmonic resonators 1003-1008, each providing absorption of incident radiation over one two wavelength bands.

FIGS. 11A-11G (1101-1107) comprise slit ring resonant (SRR) type surface structures providing increased absorption of incident radiation into the platform within limited wavelength ranges. In embodiments comprising a temperature-sensing structure such as a Seebeck sensor STE, bolometer (BT) or pyroelectric (PE) sensor, these resonant structures provide an enhancement of detectivity D* within a limited optical bandwidth range. The resonant structures may be either LC-resonant with discrete LC elements with or without plasmonic resonance enhancement. The photonic absorbing structure is resonant within one or more wavelength bands. In embodiments, the photonic absorbing structure can comprise one or more split ring resonators, LC inductive-capacitive resonators, electromagnetic THz antenna elements, and meta-material resonators that provide an increase in absorption over a limited wavelength range.

In applications wherein micro-platforms comprise pn junction photonic sensing structure, the resonant absorbent surface structures provide a range of limited bandwidth insensitivity within a wavelength range.

Figure 11A:
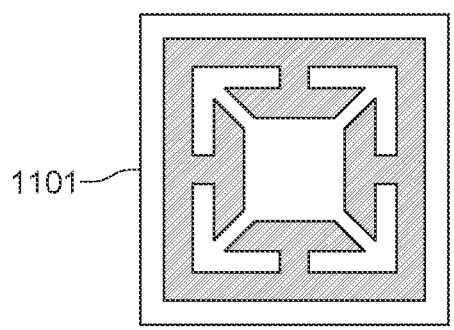
FIGS. 11A-11G depict plan views of PEIP micro-platforms with resonant structures increasing absorptivity within one or more wavelength bands.
Figure 11B:
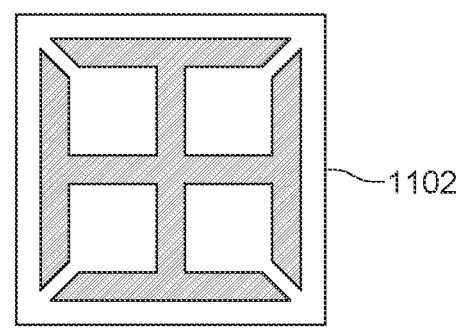
Figure 11C:
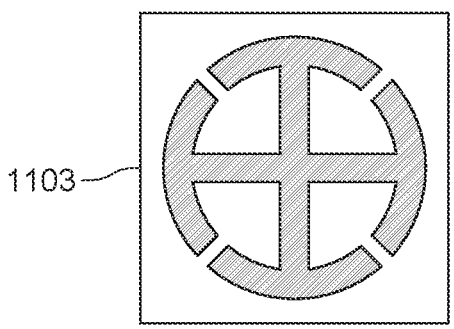
Figure 11D:
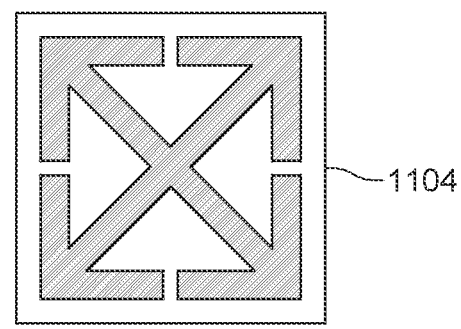
Figure 11E:
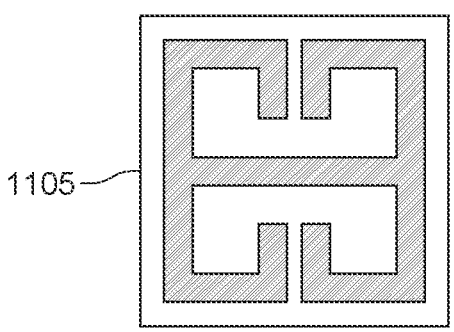
Figure 11F:
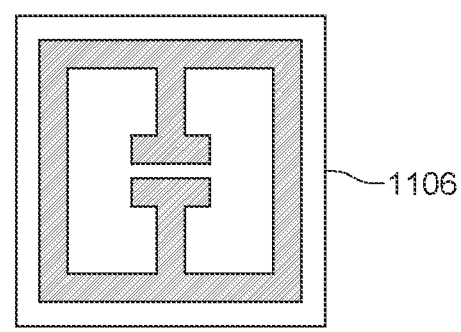
Figure 11G:
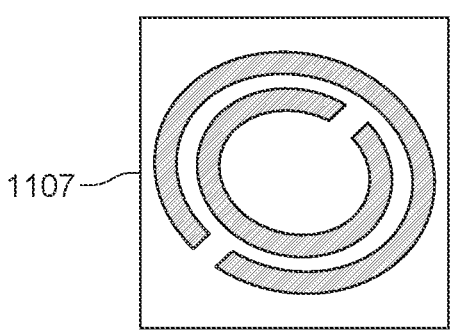
Figure 12A:
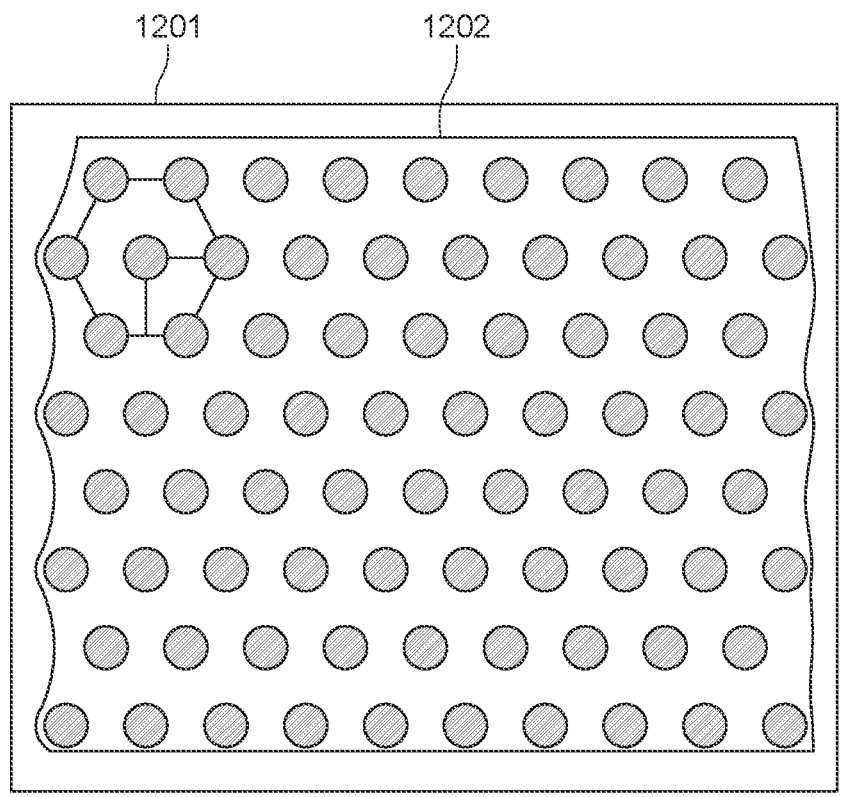
FIG. 12A depicts a plan view of a PEIP micro-platform comprising absorptive photonic crystal structure.
Figure 12B:
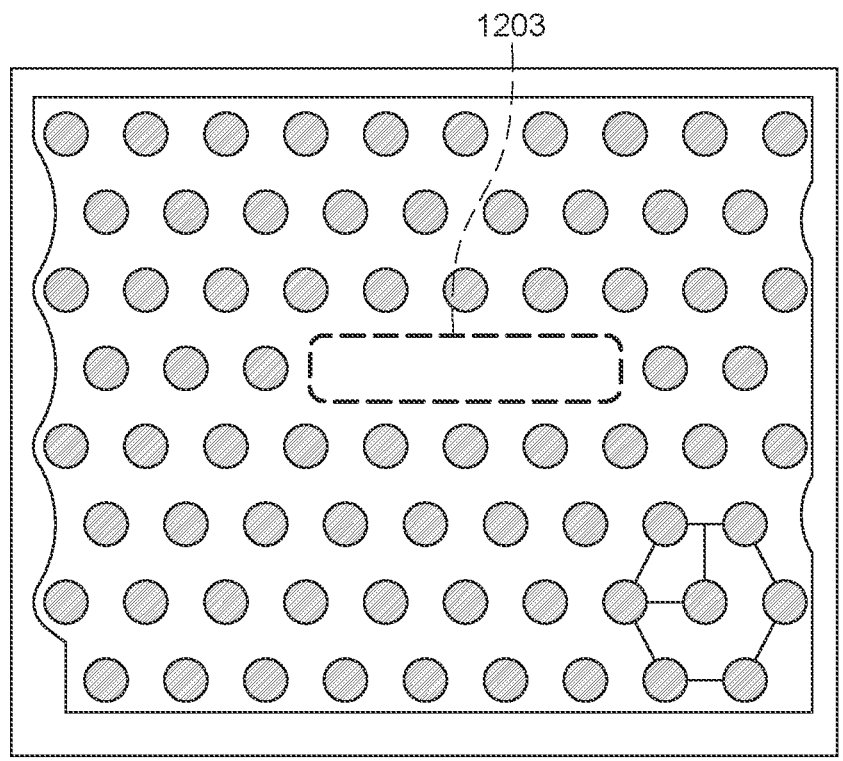
FIG. 12B depicts a plan view of a PEIP micro-platform comprising photonic crystal structure absorptive in two wavelength bands.

FIGS. 11A-11G depict absorptive resonant structures providing one or more bands of absorption depending on internal and electromagnetic-couplings between the individual structures. FIG. 11G depicts the more unique split-ring resonator which can provide efficient plasmonic resonance absorption with deep sub-wavelength dimensions FIGS. 12A and 12B depict plan views of the micro-platform 1201 comprised of photonic crystal (PhC). In FIG. 12A, the PC structure 1202 provides an increased absorptive resonance over a specific optical wavelength band corresponding to the lattice constant and dielectric constant of the of the patterned structure. The patterned photonic structure in a preferred embodiment is similar to structure of the phononic crystal PnC embodiment in nanowires. The photonic crystal (PhC) may be structured directly from the active layer of a starting SOI wafer, or it may be structured from a CVD or sputtered layer comprising a doped non-silicon thin film. FIG. 12B depicts a slotted PhC wherein the pixel responsivity is affected by the longer wavelength resonance of one or more of slots 1203.

FIGS. 12A and 12B depict the micro-platform of FIGS. 9B-9D wherein the underlying micro-platform structure 1201 and/or overlying films are structured to provide photonic crystal structure. In FIG. 12A photonic structure 1201 provides absorption of incident radiation within a single wavelength band. In FIG. 12B photonic structure 1203 provides a second wavelength band of absorption for incident radiation.

Photonic Sensing Structure Detail

In all embodiments, the pixel comprises a micro-platform having photonic sensing structure providing a signal responsive to absorbed radiation from an external source within the VIS-MM wavelength range. In a preferred embodiment, photonic sensing structure in the micro-platform comprises one or more of a Seebeck thermoelectric (STE) sensor comprising a thermoelectric couple formed of, without limitation thin films of one or more of semiconductors Si, Ge, SiGe, InSb, BiSe, BiTe and metals Al, Cu, Ti, Mo, W, Au and Pt.

In another preferred embodiment, the micro-platform is structured to comprise a thin film bolometer thermistor (BT) sensor comprising, without limitation, one or more thin-films of materials from the group Si, Ge, SiGe, InGaAS, GaAlAs, Insb, and a polytype of vanadium oxide. The micro-platform may also comprise a pyro-electric (PE) photonic sensing structure comprising, without limitation, LiTaO3, CsN3, GaN, and tourmaline. In other embodiments, the micro-platform comprises an uncooled photodiode (PD), phototransistor (PT) or photogate (PG) photonic sensor of a single semiconductor material providing a sensitivity for incident radiation within the wavelength range red, green and blue (RGB) or a longer NIR-MM wavelength range. In embodiments wherein the PD, PT or PG photonic sensor comprises a reduced bandgap such as with InSb, a PTE cooler is advantageously disposed in the micro-platform to provide cooling to cryogenic temperatures.

In some applications, the detectivity D* of the photonic sensing structure is increased by biasing the pn junction within a PD with a small forward bias current. Photonic sensor circuits comprising an STE sensor may be adapted to comprise a BT photonic sensor by providing a small bias current. Photonic sensing structure comprising a PE photonic sensor may be operated by switching the incident radiation source intensity on or off at appropriate times, or by providing a reset signal for the PE charge level at appropriate times.

The micro-platform patterned with metallic thin film structure disposed over an underlying dielectric film or cavity generally provides a more limited bandwidth for absorption or filtering of incident radiation, and provides an exposed surface of high absorptivity within a reduced wavelength range. In embodiments, the conducting film is layered on an underlying film comprising, without limitation, one or more layers of SiO2, SiN, SiOxNy, HfO2 and TiN. In embodiments, the thin film photonic sensing structures within the micro-platform are comprised of materials different from the base structure of the micro-platform.

In preferred embodiments, the PD or PT photonic sensing structure comprises a type II super lattice structure further comprising a heterostructured diode. The heterostructured diode or transistor may be bonded into the micro-platform.

In another preferred embodiment, a photodiode (PD) or phototransistor (PT) is disposed directly into the substrate within the cavity and external to the micro-platform. The photodiode (PD) or phototransistor (PT) may comprise one or more pn junctions of a single semiconductor type, such as Si, Ge, GaP, GaN, InSb, InAs.

Type II Superlattice Photonic Sensing Structure

The PD or PT structure may comprise several epitaxial layers of different semiconductors wherein the layers have almost identical lattice spacing constants to provide crystalline-growth compatibility, such as within the In—As—Ga—Sb family of semiconductors. In this family of semiconductors, the lattice constant is 0.61 nm permitting synthesis of MOCVD or MBE epitaxy layered at nanometer scale.

Figure 13A:
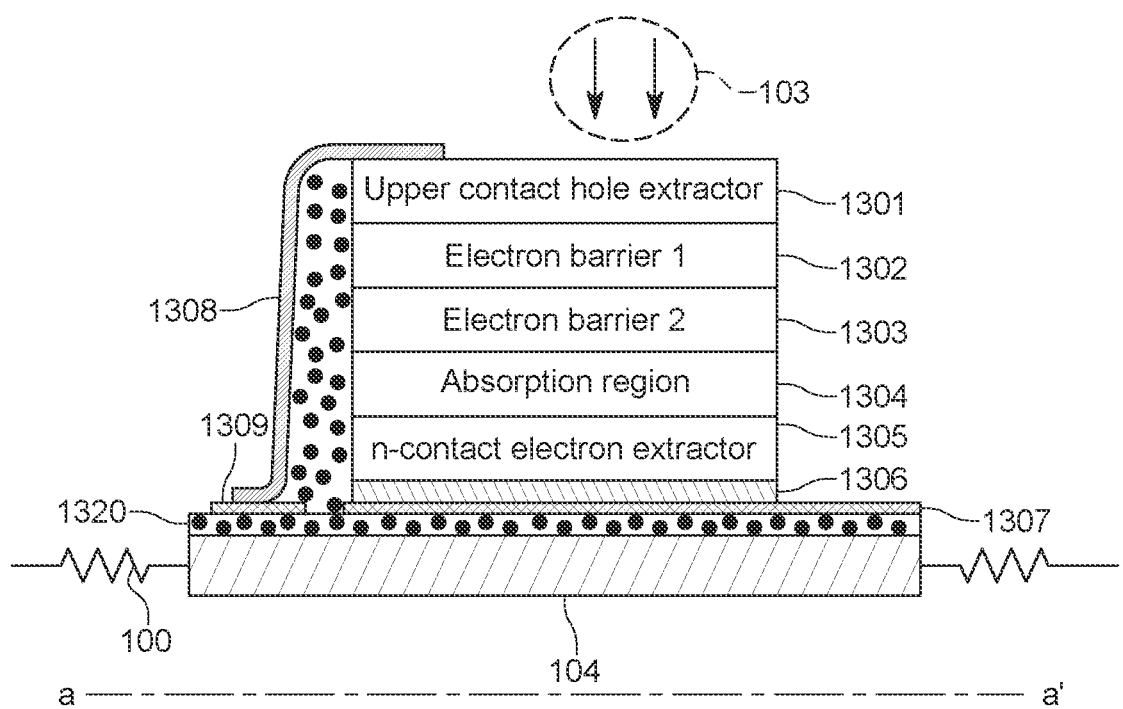
FIG. 13A depicts a cross-sectional view of a PEIP micro-platform comprising a photodiode (PD) embodiment.

FIG. 13A depicts a cross-sectional view a-a' of the micro-platform comprising a layered photodiode (PD) further comprising a layered type II superlattice (T2SL) epitaxial structure with semiconductor layers having similar lattice constants. Incident photonic radiation 103 enters the topside n-type semiconductor 1301 layers comprising a upper contact and hole extractor portion of a heterojunction which is transparent to the incident radiation. Radiation 103 propagates through the three topside layered regions 1301, 1302, 1303 and is absorbed selectively into absorptive layers 1304 having a reduced energy bandgap. Interband tunneling within the superlattice limits electron flow from the absorption region 1304 upward into the topmost layer 1303 wherein current flow in connecting wire 1317 is due to holes reaching layer 1301. In layer 1305 there is no barrier for electrons to flow from recombination and electron current flows into and through metal film 1307. Layer 1306 is an underlying layer that facilitates physically separating the layered thin films 1301-1305 from a starting wafer that provided rigidity during growth of the MOCVD or MBE layers. The photodiode (PD) of FIG. 13A is reverse biased wherein the reverse bias current is very sensitive to charge created as incident radiation 103 is absorbed in the T2SL superlattice structure.

The PD of FIG. 13A is bonded over dielectric film 1307 onto micro-platform 104 connecting into nanowires 100. Diode PD is connected into nanowires 100 via bonded wires 1308, 1309 from the p-contact and from the n-contact metallization 1307. A thin film of SiO2 1320 covering base micro-platform 104 provides electrical isolation between connections 1307 and 1309

In a preferred embodiment, micro-platform 104 comprises a Peltier thermoelectric (PTE) cooling element powered through two nanowires from a power source external to the pixel. In this embodiment comprising the PTE, the micro-platform is supported by at least four nanowires, two nanowires connecting to the photonic sensing structure, and the other two nanowires comprising a portion of the Peltier thermoelectric (PTE) cooling structure.

Figure 13B:
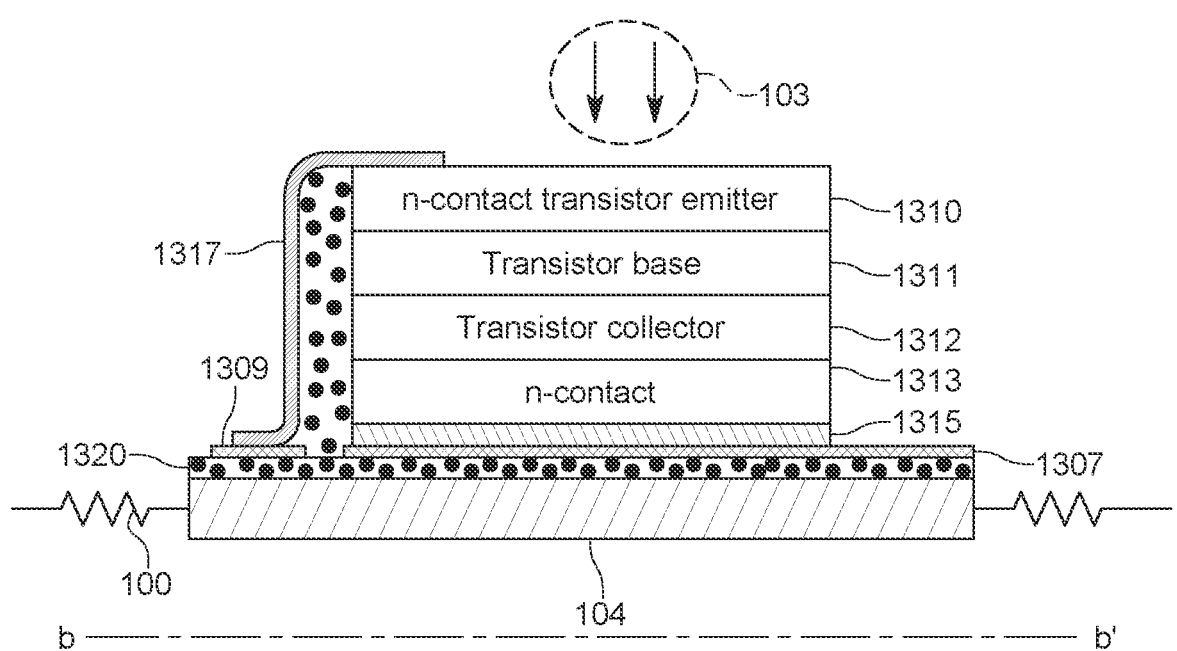
FIG. 13B depicts a cross-sectional view of a PEIP micro-platform comprising a phototransistor (PT).

FIG. 13B depicts a cross-sectional view b-b' of the micro-platform comprising a layered phototransistor (PT) of NPN type, further comprising a type 2 superlattice emitter 1310 which injects photoelectron current into the p-doped transistor base 1311. T2SL structure comprises the transistor base 1311, collector 1312 and n contact layers 1310, 1313. A buffer layer 1315 with a lattice constant intermediate between the 0.61 nm lattice constant of the phototransistor layers facilitates growth of the multiple epi layers within the phototransistor.

In the depicted FIG. 13A, layered structures 1301-1305, and in FIG. 13B the layered structures 1310-1315 comprising superlattice structure are prior art wherein base semiconductor materials comprise doped and undoped stacked layers of InAs/AlSb/GaSb grown on a GaSb starting wafer.

The multi-layer diode PD and transistor PT photonic sensors comprising type II superlattice structure are generally grown on a III-V substrate and the III-V substrate is removed from the T2SL structure prior to bonding onto a substrate such as the silicon micro-platform.

The technology for transferring the III-V type II superlattice PD and PT structure of FIGS. 13A and 13B onto a silicon platform are well known to experts in the art, see for example Reference: G. Roelkens et al, "III-V-on-silicon photonic devices for optical communication and sensing", Photonics, vol. 3, 969-1004 (2015); doi: 10.10.3390/photonics2030969. Another technique for removing the III-V substrate prior to bonding is implemented with an ion implanted layer which permits peeling off of the PD or PT photonic sensor is provided, for example, in Carr and Usenko, U.S. Pat. No. 6,346,459 issued Feb. 12, 2002.

Figure 13C:
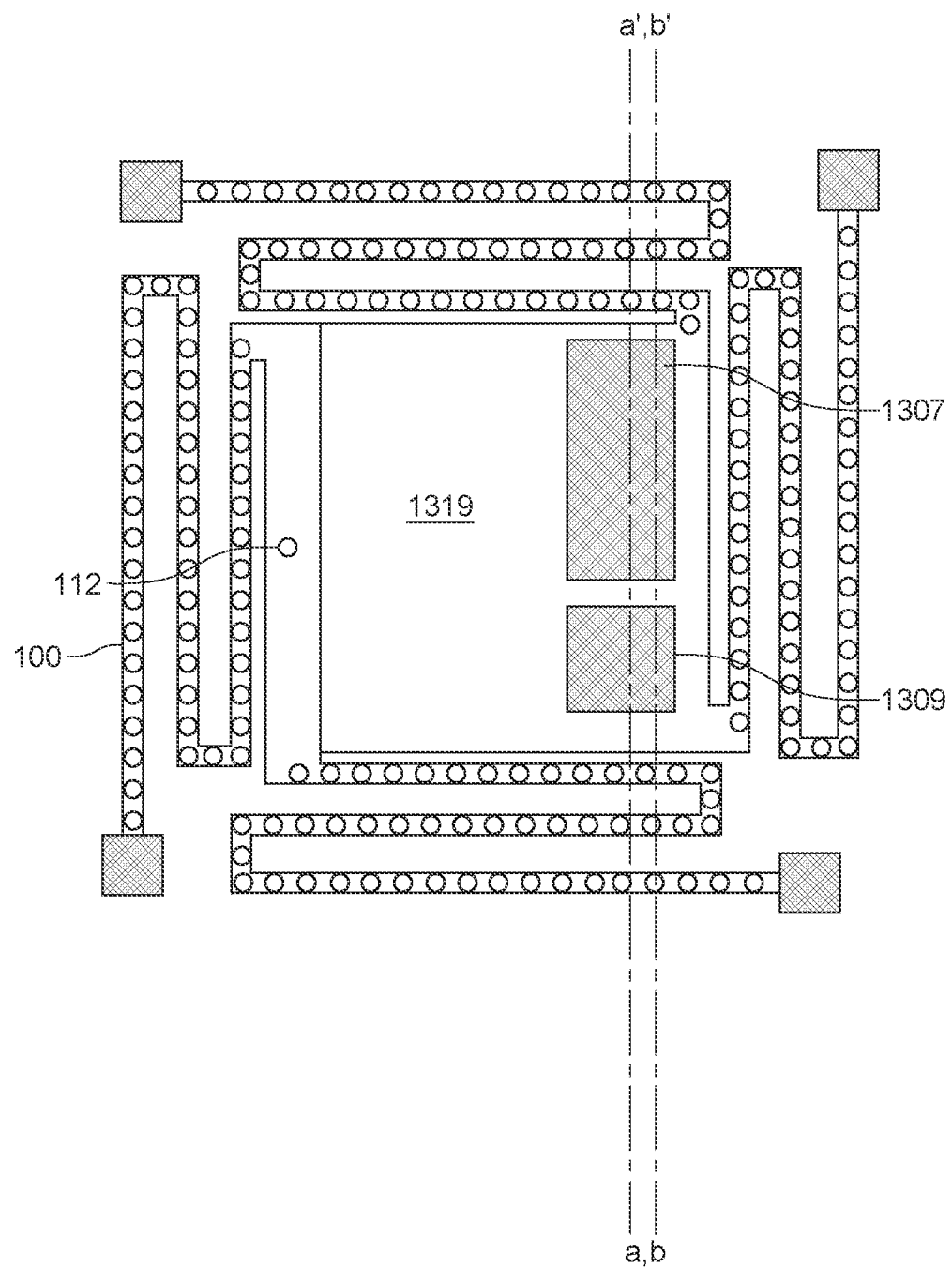
FIG. 13C depicts a plan view of plane comprising the foundation platform and supporting nanowires for the PD of FIG. 13A and the PT of FIG. 3B.

In the preferred embodiments of FIGS. 13A, 13B and 13C nanowires 100 and the foundation micro-platform 104 are formed from the active layer of a starting SDI wafer.

FIG. 13C depicts a plan view defined by section planes a-a' and b-b' of FIGS. 13A and 13B wherein the micro-platform 1319 comprises both a PTE cooling structure and the T2SL heterostructure. Micro-platform 1319 is supported by four nanowires 100 wherein contacts 1307, 1309 from the PD or PT of FIGS. 13A, 13B are mated to corresponding contacts on the micro-platform. FIG. 13C depicts a foundation micro-platform 1319 comprising a Peltier thermoelectric (PTE) structure in addition to the contacts 1307, 1309 contacting the PD and PT sensors of FIGS. 13A and 13B. Two of the four nanowires 100 depicted in this embodiment are connected through bonding pads 1307, 1309 into the PD or PT of FIGS. 13A and 13B. The other two of the four nanowires 100 comprise a portion of a Peltier thermoelectric (PTE) cooler structure, wherein the Peltier junction is disposed in the micro-platform 1319.

In most pixel embodiments, the micro-platform is completely or almost completely formed prior to release to create the cavity 112 and release from the substrate. Platform release is generally obtained using a patterned etch comprising hot vapor HF which removes the BOX oxide underneath the micro-platform in embodiments wherein the starting wafer is silicon SOL In the preferred embodiment of depicted in FIG. 13C with PTE micro-refrigeration, detectivity D* of the cooled T2SL structure is increased beyond levels achievable with uncooled operation. Embodiments wherein the micro-platform comprises a photodiode (PD) or phototransistor (PT) having T2SL structure and cooled to cryogenic temperature with an integral Peltier thermoelectric (PTE) device can provide an infrared detectivity D* level orders of magnitude above the uncooled Kruse limit of $2 \times 10^{10}$ cm $\sqrt{Hz}$/watt modeled for thermal sensors of types STE, BT and PE.

Pixel embodiments with and without the Peltier thermoelectric (PTE) cooler advantageously comprise a topside second substrate providing a hermetic or near hermetic cavity 112 for the nanowires and micro-platform. The hermetic cavity may be maintained in a vacuum condition or filled with a gas of low thermal conductivity. This environment of reduced thermal conduction through a surrounding gas or convection within the cavity reduces the power requirement for the Peltier thermoelectric cooler and increases detectivity D* by reducing thermally-related noise created within the T2SL sensing structure.

Pixel CMOS Address and Readout Circuits

Figure 14:
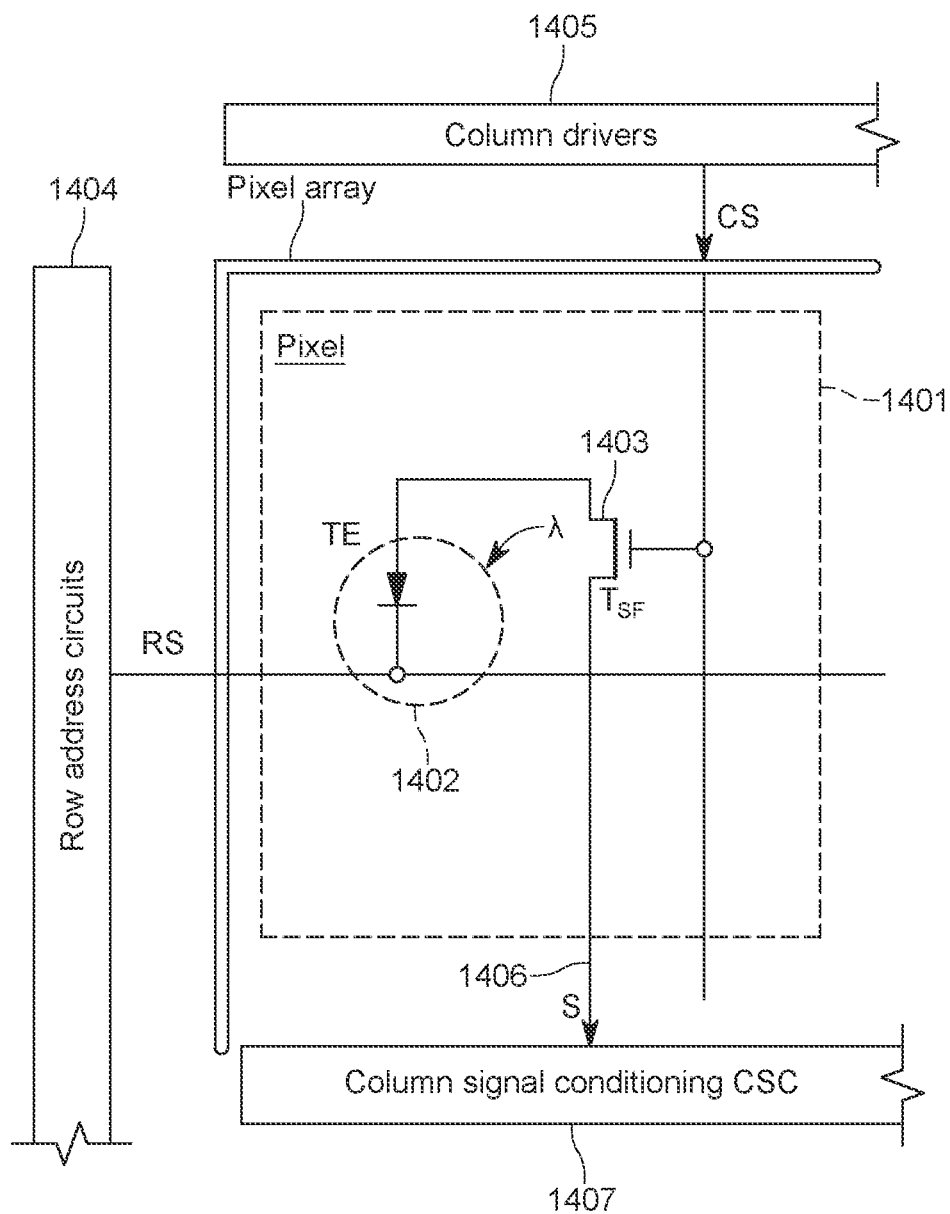
FIG. 14 depicts a PEIP with the micro-platform and nanowires connected into a source-follower circuit addressed by a CS addressing transistor TSF.

FIG. 14 is a schematic circuit depicting pixel 1401 comprising a thermal micro-platform 1402, wherein the sensor voltage signal is gated onto column line S 1406 through MOSFET 1403. One nanowire of the micro-platform connects directly into the row address RS line of the row address circuits 1404. Signal through the other platform nanowire is gated into pixel signal S 1406 through MOSFET 1403 and into external column signal conditioning (CSC) circuit 1407. Gating transistor 1403 is enabled by signal CS from column drivers 1405. When the pixel 1401 is disposed within a columnar array of pixels, column select CS enables all pixels in the connected column. In this illustrative embodiment, the depicted sensor is of Seebeck thermoelectric (STE) type. The minimum signal levels near noise level for the STE sensor 1402 in imager applications are in the sub-microvolt range. In some embodiments, a voltage signal amplifier is added to the signal chain within each pixel to increase signal levels. The pixel circuit of FIG. 14 adapted for photonic sensor structure of BT and PE types provides a higher signal level at the expense of slightly higher circuit complexity.

Figure 15A:
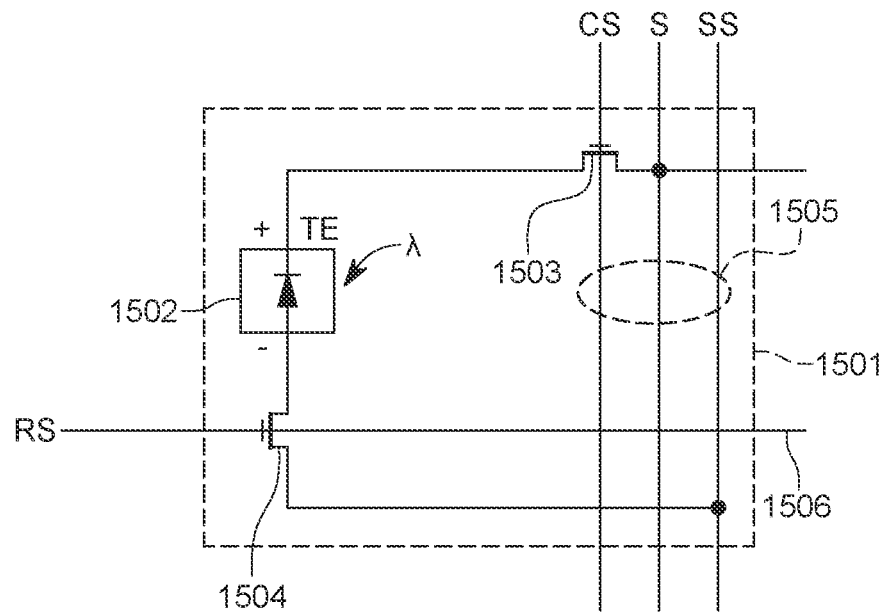
FIG. 15A depicts a PEIP with the pixel signal S interrogated directly with RS and CS addressing transistors.

FIG. 15A depicts the pixel 1501 wherein a PTE thermal detector on micro-platform 1502 is gated onto columnar signal line S by MOSFET 1503. One terminal of the micro-platform 1502 is gated to substrate reference ground SS via transistor 1504 and enabling row select RS 1506. The three columnar lines 1505 comprise column select CS signal, substrate SS ground level and signal line S.

Figure 15B:
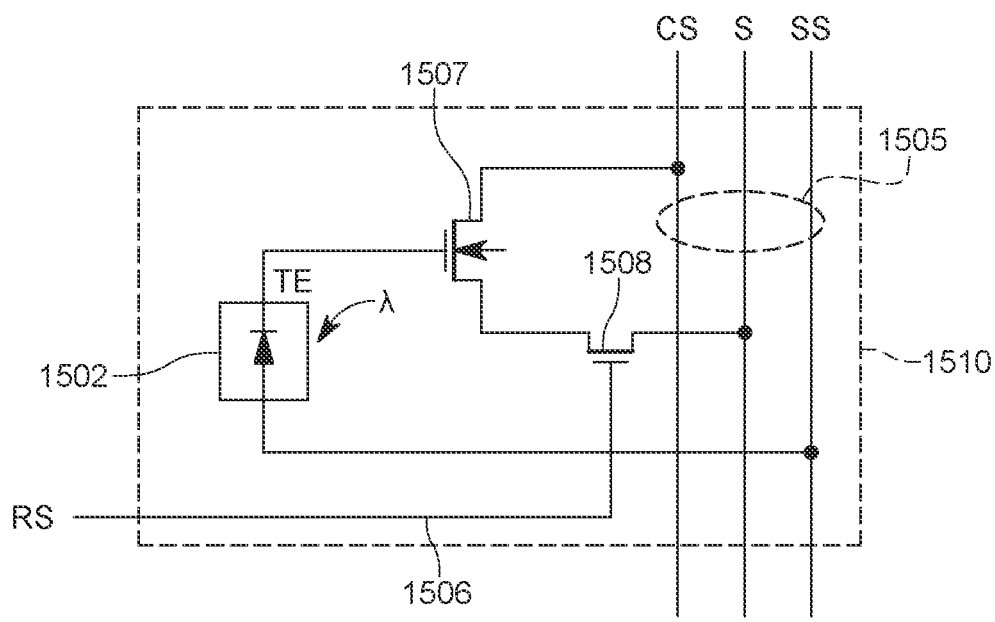
FIG. 15B depicts a PEIP with the pixel signal S interrogated directly through a source follower with the CS address line and a RS transistor.

FIG. 15B depicts the pixel 1510 comprising three column wires 1505 including column select CS, pixel signal S, and substrate ground reference SS. Row select RS 1506 enables MOSFET 1508 connecting one nanowire to columnar pixel signal line S. The other nanowire from micro-platform 1502 is directly connected into substrate ground SS. The photonic sensor 1502 is depicted as PTE type. In this embodiment, MOSFET 1507 within a source follower amp circuit is a depletion-mode n-channel MOSFET which generally provides the best match for the reduced signal level from PTE sensor 1502.

Photonic Sensor Array Adapted to Comprise VIS-NIR Structure

Figure 16:
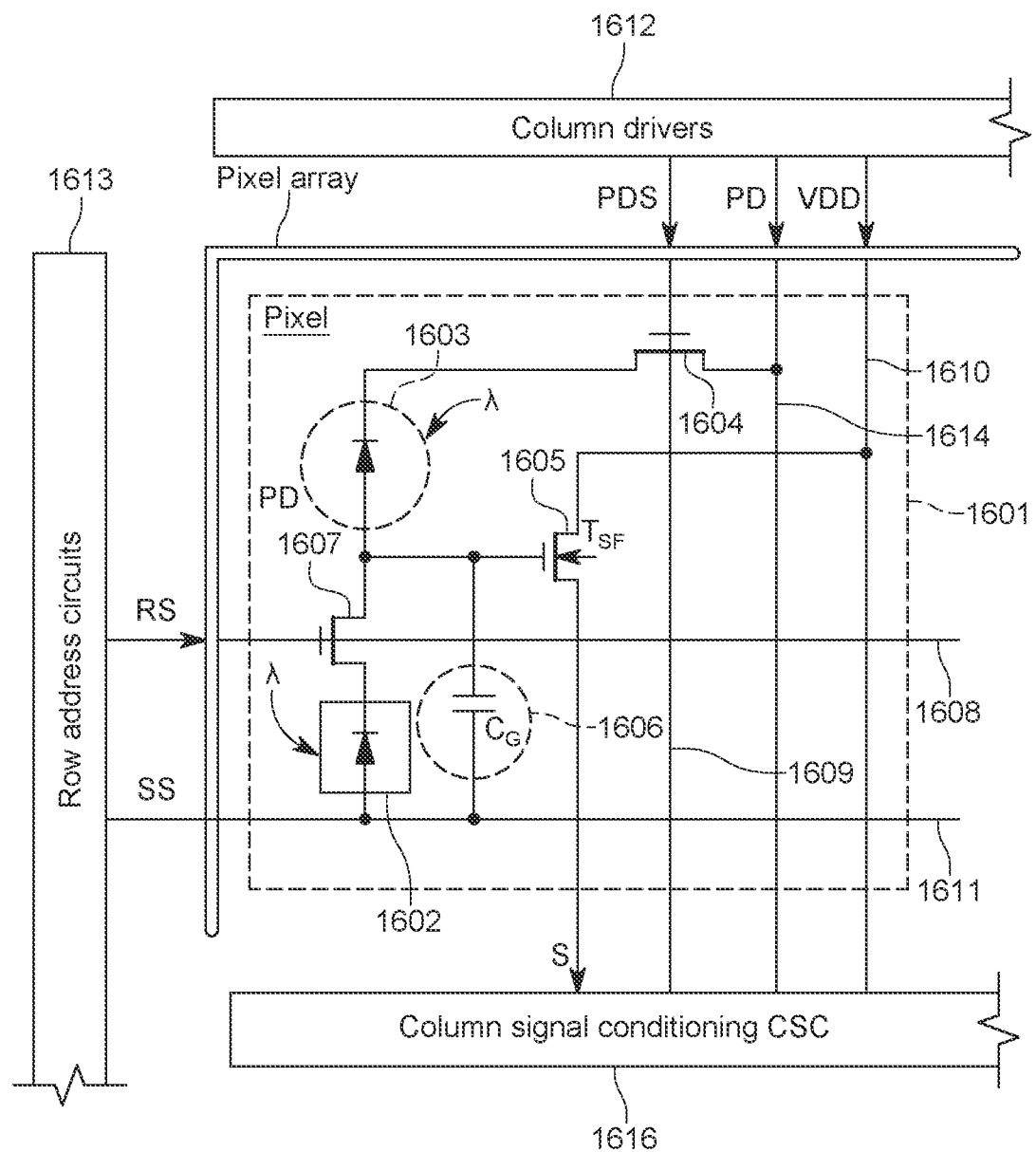
FIG. 16 depicts an embodiment of the PEIP adapted with an embodiment comprising a photodiode disposed on the pixel surrounding first substrate.
Figure 17:
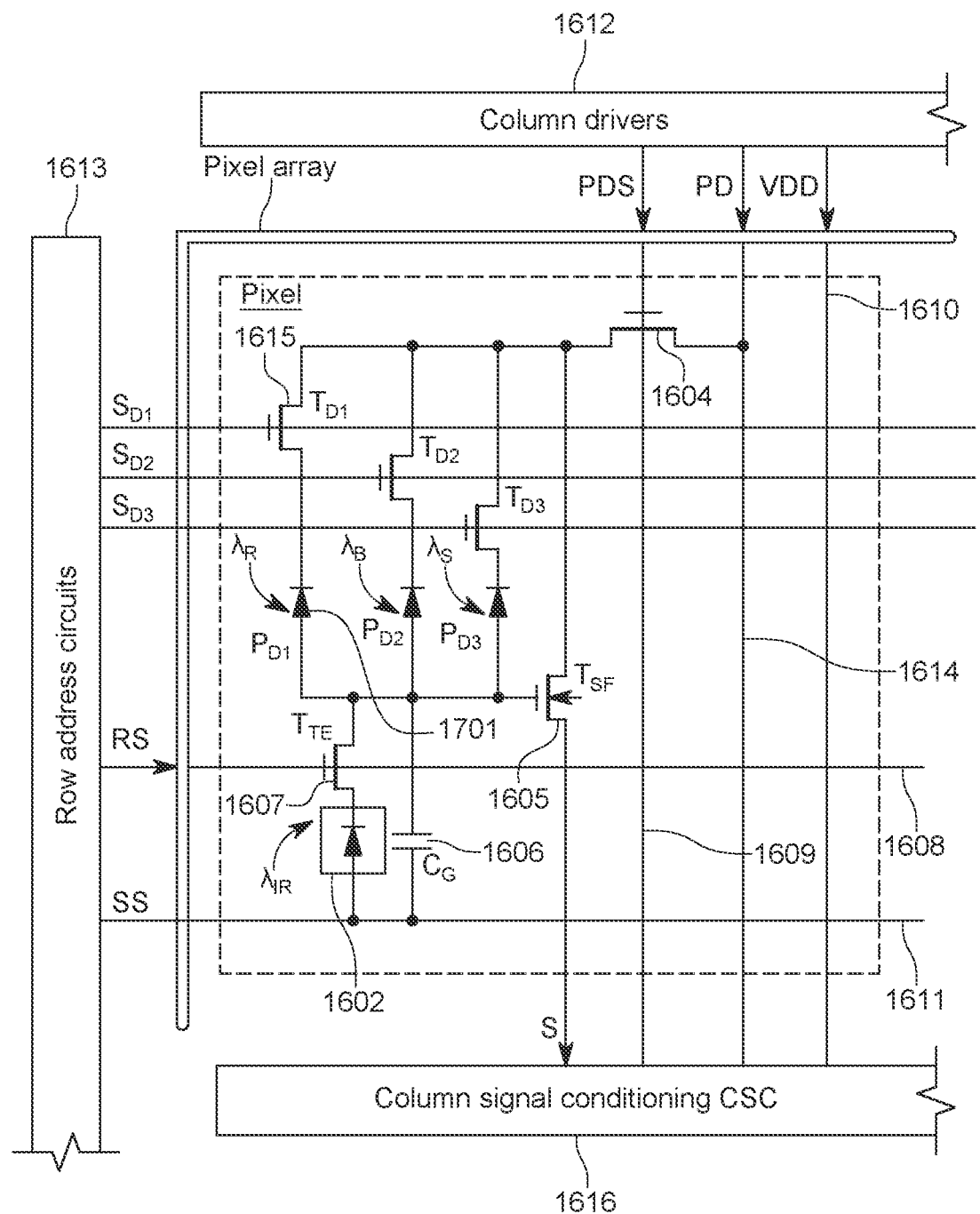
FIG. 17 depicts an embodiment of the PEIP adapted with an embodiment comprising separate R, G and B photodiodes.

FIGS. 16 and 17 depict the circuit for a hyperspectral pixel embodiment comprising a first subpixel circuit with an STE sensor 1602 providing sensitivity within the NIR-MM wavelength range and a second subpixel circuit with a photodiode PD sensor 1603 providing sensitivity within the VIS-NIR wavelength range. FIG. 16 discloses a pixel comprising a single photodiode 1603 and FIG. 17 expands the circuit of FIG. 16 to three photodiodes 1701. The first subpixel circuit is enabled and readout during time phase 1 wherein the STE sensor signal is gated into source follower depletion-type N-MOSFET 1605 with supply voltage VDD 1610. The first subpixel signal is sensed as S into column signal conditioning circuit CSC 1616. During phase 1 MOSFET control line PD is set to zero signal reference level SS 1611, MOSFET 1604 is disabled by signal PDS 1609 and MOSFET 1607 is enabled by signal RS 1608. During the phase 1 photodiode 1603 does not affect signal from the first subpixel. Subpixel 1 and subpixel 2 share the same source follower circuit gating through MOSFET 1605. Column drivers 1612 and row address circuits 1613 are also shown.

A signal from the second subpixel of FIG. 16 is readout during a sequence of 3 additional operational phases. During phase 2 a charge is stored on the photodiode PD 1603 with PD set to +VDD level and transistor 1604 enabled. Simultaneously, transistor 1607 is enabled by RS wherein the voltage across capacitor CG 1606 is set to a few microvolts, a negligible level for RGB readout. In phase 3, RS disables transistor 1607 and column line level PD is reduced to circuit ground SS level resulting a translation shift of voltage across capacitor CG 1606 to a negative VDD level. At the end of phase 3 signal output level S2 obtained through pixel output transistor 1605 is recorded by an ADC external to the pixel. Next during phase 4 the voltage across PD 1603 reduces the gate voltage on transistor 1605 via capacitor CG 1606 sensitive to the intensity of VIS-NIR radiation incident into PD 1603. At the end of phase 4, reduced signal output level S3 is obtained from the connected ADC. During the time lapse of phase 4, the difference between signal output levels S3 and S2 as determined is proportional to the intensity of incident RGB radiation during phase 4. In applications based on the hyperspectral imaging pixel of FIG. 16, these four phases are repeated each frame of pixel display frame interrogation.

The readout sequence for the hyperspectral pixel of FIG. 17 is similar to that for FIG. 16 except that three additional time intervals are needed to readout each of the three photodiodes 1701. Each of the three photodiodes PD1, PD2, PD3 is selected by appropriate enabling signals SD1, SD2, SD3 enabled at separate times by enabling MOSFET TD1, TD2, TD3 1615.

The circuit changes necessary to adapt the circuits of FIGS. 16 and 17 for thermal BT and PE type photonic sensor structures is relatively minor.

Figure 18:
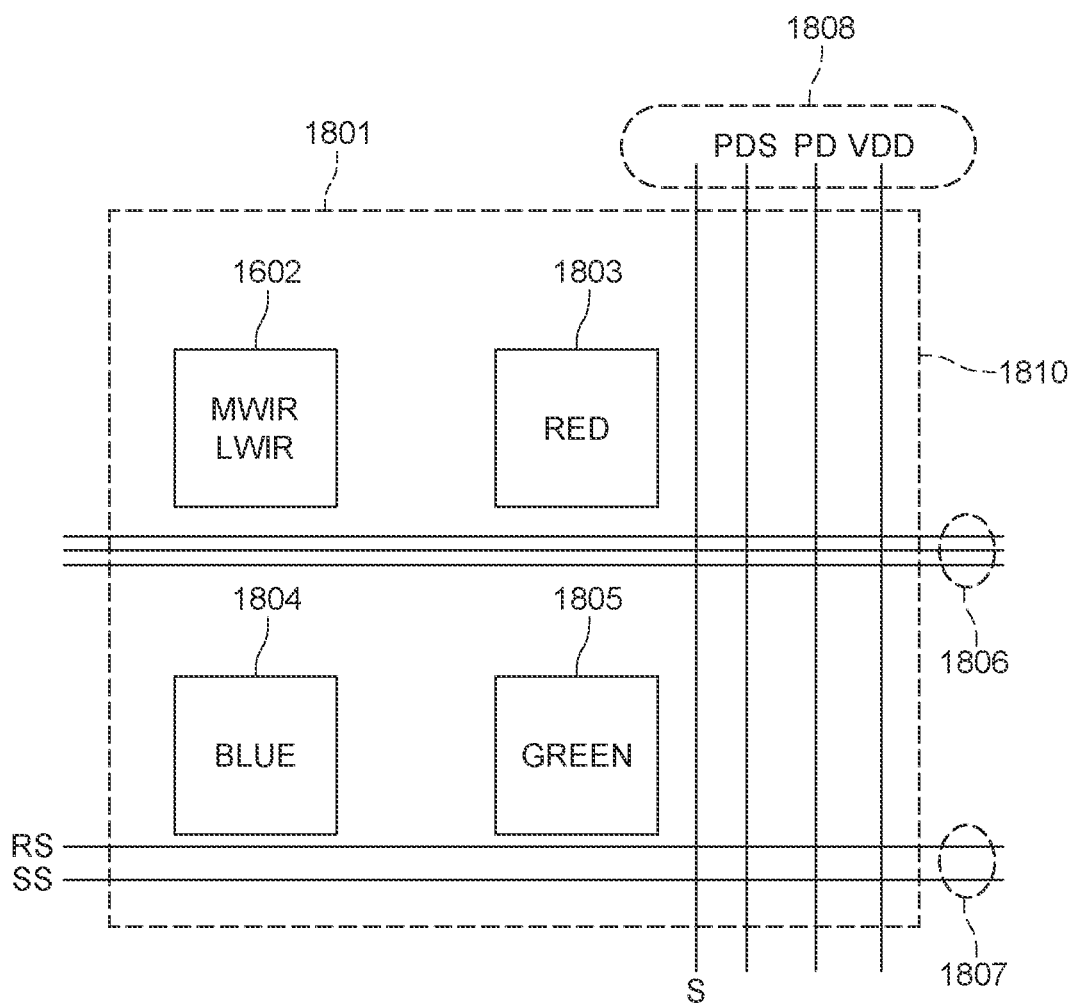
FIG. 18 depicts a plan view of the embodiment of FIG. 17 with separate RGB address lines.

FIG. 18 depicts the plan view of an embodiment pixel 1801 application based on the hyperspectral pixel of FIG. 17 comprising the first thermal subpixel 1801 and three photodiodes red 1803, green 1805 and blue 1804. The hyperspectral pixel 1801 of FIG. 18 interfaces with column lines 1808 comprising drivers PDS, PD, VDD and signal line S. Row address circuits source lines SD1, SD2, SD3, 1806, RS and SS 1807. The MWIR LWIR 1602 is also illustrated.

Figure 19:
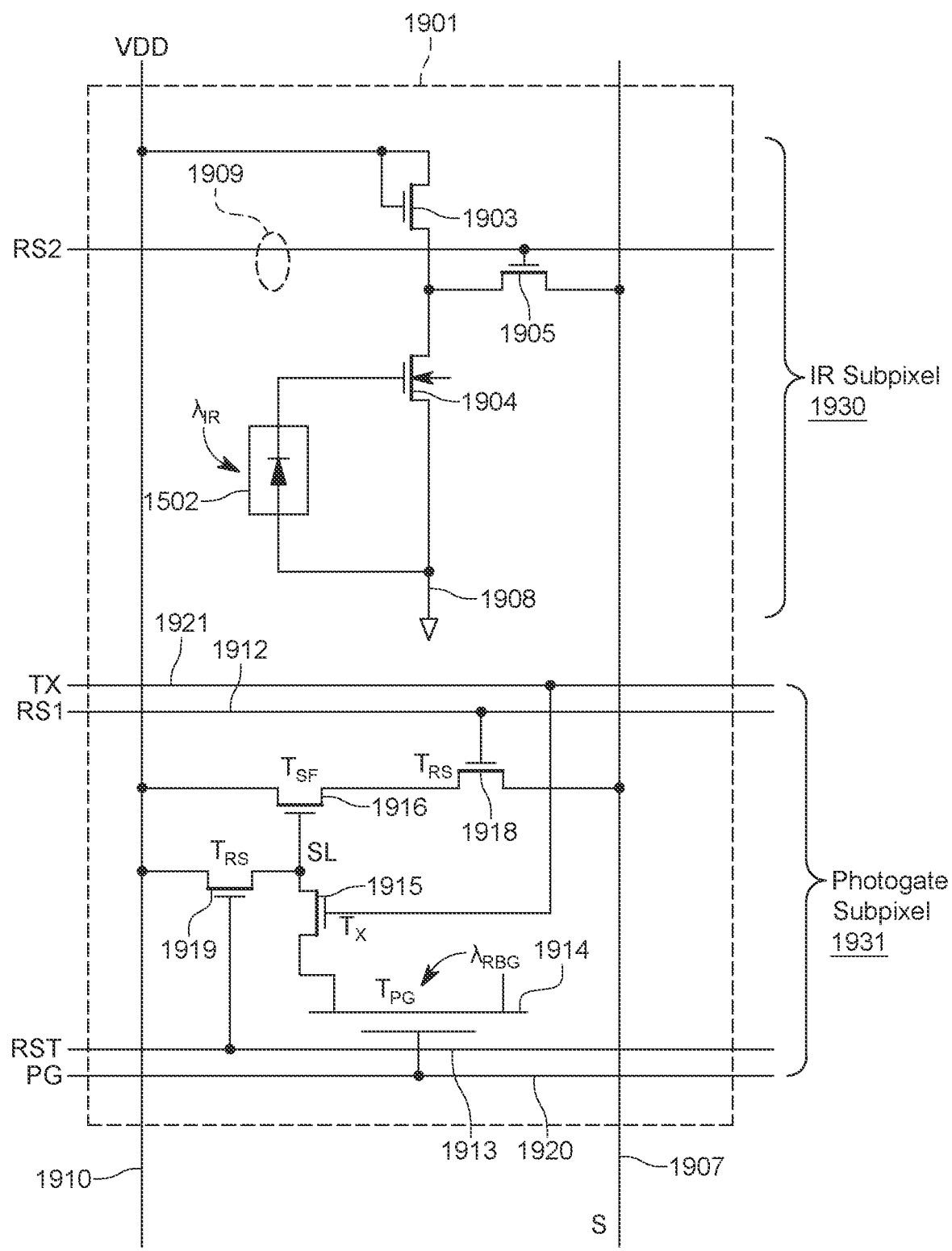
FIG. 19 depicts the PEIP adapted with an embodiment comprising a subpixel1 comprising a thermal sensor and a subpixel2 comprising a photogate PG sensitive to VIS and NIR wavelengths.

FIG. 19 is a schematic circuit of a preferred embodiment depicting hyperspectral pixel 1901 comprising two subpixels: IR thermal subpixel 1930 and a photogate subpixel 1931. The subpixel accumulates charge into a potential well as incident radiation is absorbed into the photogate PG. This accumulated charge is transferred via a CCD process into a signal diffusion node SL during a first interval 1.

Hyperspectral Pixel with CCD-Type Internal Charge Transfer

FIG. 19 depicts a hyperspectral pixel circuit 1901 comprising a thermal IR subpixel 1930 sensitive to incident radiation within the NIR-MM wavelength range and photogate subpixel 1931 sensitive to incident radiation within the VIS-MM wavelength range. The thermal subpixel is comprised of a STE micro-platform sensor 1502 connected into depletion-mode N-MOSFET 1904 within a gain amplifier positioned above the ground VSS 1908, and having load transistor 1903 and row select addressing with MOSFET 1905 enabled by RS2 1909. During a first time phase1 signal S 1907 from STE sensor 1502 is provided into an external column signal conditioning circuit. Signal level S is sensitive to the temperature of the micro-platform heated by incident absorbed radiation. Operation of the photogate subpixel 1931 is disclosed using the MOSFET model within subpixel circuit 1931 of FIG. 19 and also with the structural cross-section and circuit of FIGS. 20A and 20B. In FIG. 19 during an operational phase 2 the voltage at node SL is set to VDD 1910 by briefly enabling MOSFET TRS 1919 with control line RST 1913 above PG 1920 and with MOSFET TX 1915 disabled. During a phase 3 signal level VREF sensitive to the voltage at node SL is provided by source follower amplifier comprised of MOSFETs TSF 1916 and TRS 1918 into signal line C 1907 and signal conditioning circuits. During phase 4 MOSFET TX 1915 is disabled and charge is accumulated into charge bucket 1914 is proportional to the intensity of incident radiation within the VIS-NIR wavelength range absorbed. At the end of phase 4 MOSFET TX 1915 is enabled and the charge at near level VDD is reduced by electrons accumulating into the charge bucket during phase4. At the end of phase 4 a signal level VSIG sensitive to the voltage at node SL is again provided by enabling the source follower and signal VSIG into conditioning circuits. In addition, RS1 1912 is illustrated below TX 1921.

Figure 20A:
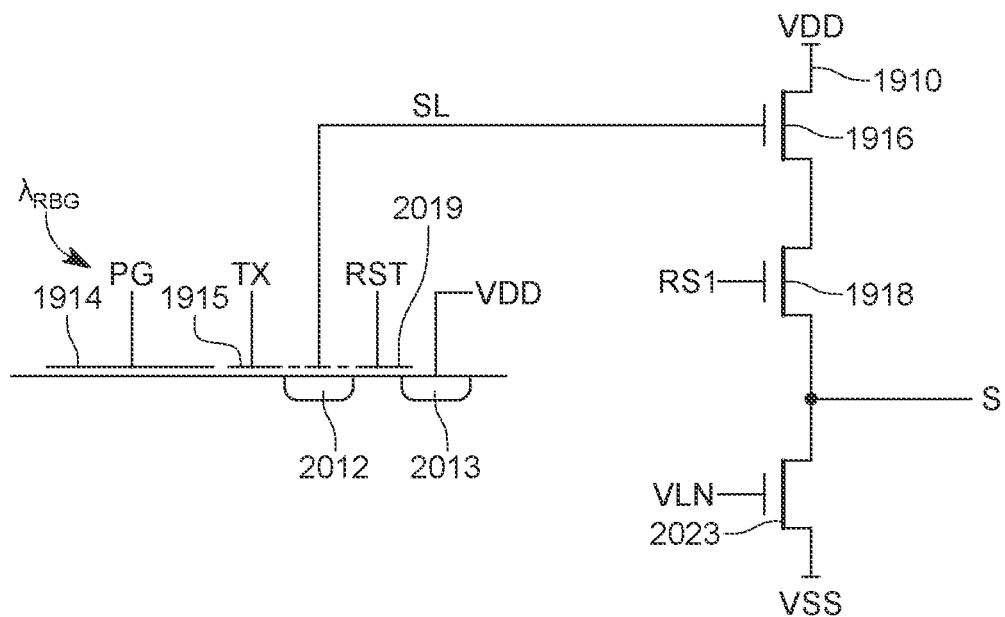
FIG. 20A depicts a cross-section view and the circuit of the PEIP embodiment of FIG. 19 comprising a single photogate providing a charge-coupled photonic signal SL.
Figure 20B:
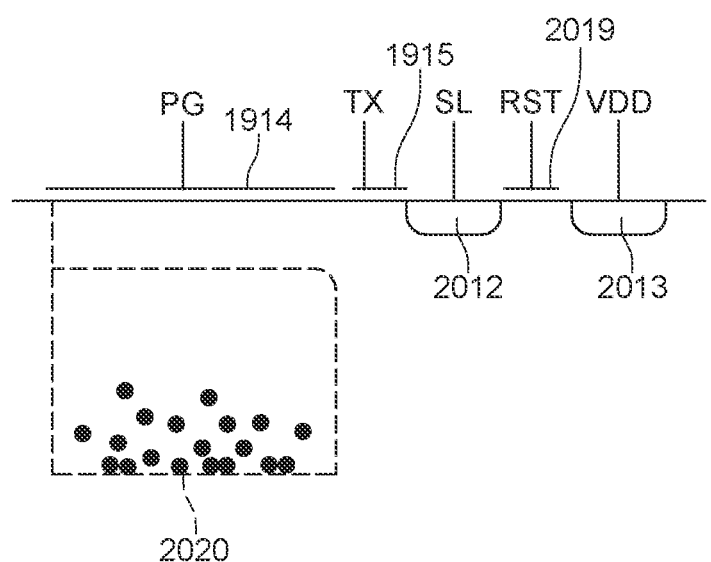
FIG. 20B depicts a cross-sectional view of the photogate and charge transfer structure of FIGS. 19 and 20A.

FIGS. 20A and 20B provide further insight into the internal detection mechanism of the photogate operation. Photogate PG 1914 comprises a floating diffusion 2020 with or without an overlying electrical contact PG 1914. During image sensing phase 4 potential well PG 2020 collects electrons created as incident absorbed radiation is absorbed into the substrate potential well PG 2020. During phase 2, controlled RST 2019 enables the MOSFET comprising emitter 2012 and collector 2013 and sets the signal SL to VDD level. At the beginning and end of phase 4, the signal level voltages at node SL 2012 is VREF and VSIG, respectively, are read out through the source follower circuit comprised of depletion type driver N-MOSFET TSF 1916, and TRS N-MOSFET 1918 and N-MOSFET load 2023.

During the reset portion of the subpixel interrogation cycle, reset level RST enables the reset transistor provided by row address circuitry sets the potential at SL node to VDD voltage level. This reset operation begins an interrogation cycle wherein signal node SL is set to a VDD level with enabling reset signal RST. Next, charge is collected into the well under the photogate electrode 1914 during an absorptive signal acquisition time interval. Charge is transferred into signal node SL during a transfer TX interval. In the photogate subpixel 1931 of FIG. 20A, the acquisition interval ends as signal charge is transferred into floating node SL. Subpixel signal S is read out from node 1910 through source follower transistor 1916, row select transistor 1918 with load transistor VLN1 2023 of FIG. 19.

For readout of successive display frames in an imager application, the 4-phase process implemented by the subpixel 1 and subpixel 2 circuits are repeated.

The pixel in most embodiments may be modified to comprise BT and PE thermal sensors with the addition of a current biasing source, signal-reset shorting gate, and source follower transistors as appropriate.

The photogate subpixel circuit 1931 is prior art from E. R. Fossum et al, "Active pixel sensor with intra-pixel chare transfer", U.S. Pat. No. 5,471,515 issued Nov. 28, 1995, disclosing a CMOS imaging pixel comprising a photogate with CCD charge transfer for readout and a correlated double sampling signal conditioning pixel circuit.

In-Pixel Noise Reduction Circuits

Figure 21:
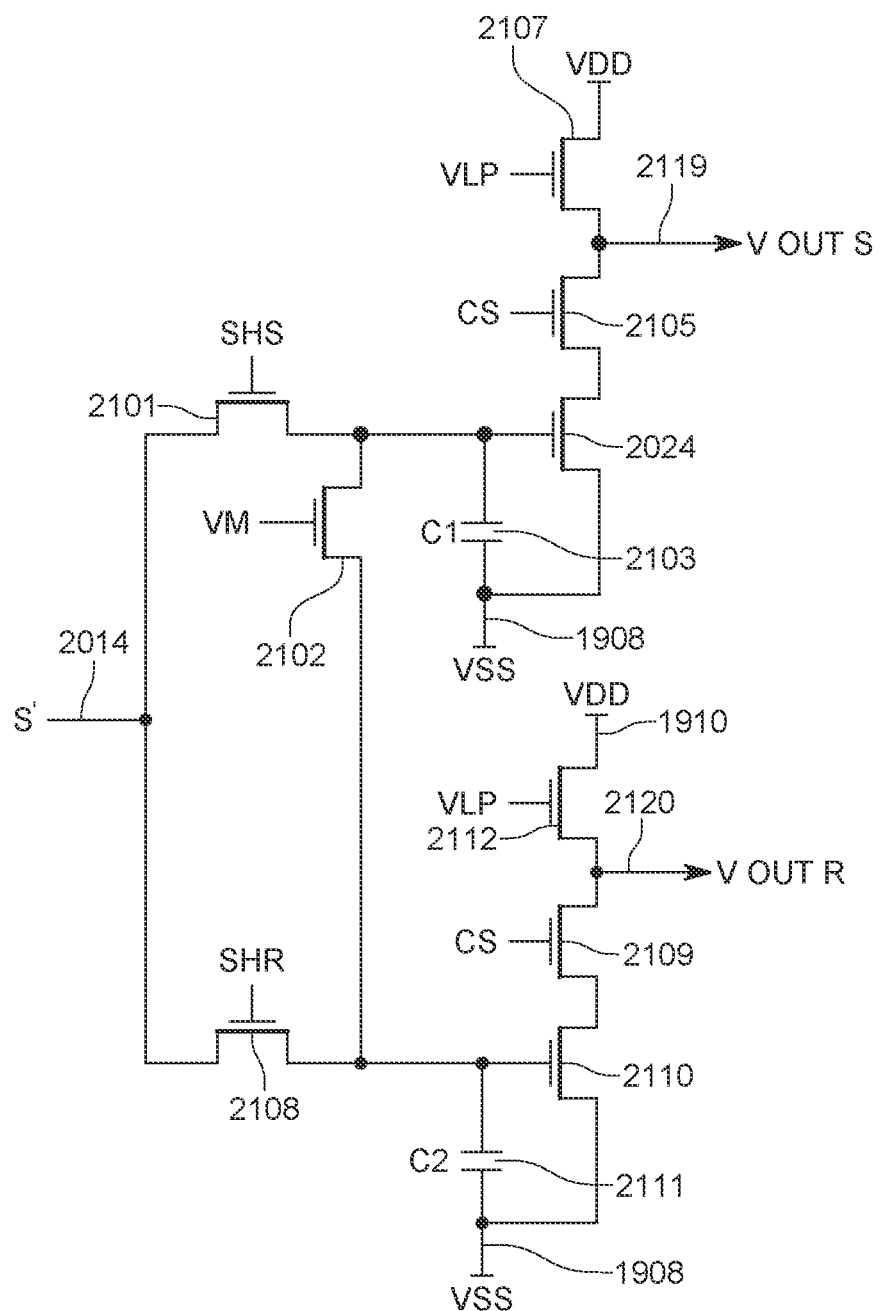
FIG. 21 depicts a prior-art transistor circuit schematic of a correlated double sampling (CDS) circuit providing signal processing in pixel or external to the pixel.

FIG. 21 is a prior-art schematic circuit providing correlated double sampling (CDS) of a positive-going voltage level sensor signal S' originating from the photonic sensing structure within the pixel. The CDS circuit may be disposed within a pixel, or within connected ROIC column signal conditioning circuits. The CDS circuit is connected to the infrared sensing structure to provide a reduction of fixed pattern, kT/C and 1/f noise within a limited sampling circuit bandwidth. The analog signal S' 2014 obtained from the photonic sensing structure, conditioned by any additional circuitry providing signal gain, is processed to provide a separate sensor signal V OUT S 2119 and a voltage reference signal V OUT R 2120 as a differential signal pair, generally input into external ROIC circuitry.

In embodiments of this invention, control signal SHS with MOSFET 2101 acquires a sensing signal determined by the intensity of absorbed incident radiation into a photonic sensing structure. In embodiments of this invention, control signal SHR with MOSFET 2108 acquires a reference signal from the photonic sensing structure immediately prior to a display frame acquisition interval. A sensor signal readout portion of the CDS circuit consists of a signal sample and hold (S/H) circuit including transistor SHS 2101 wherein pixel signal S' is gated onto capacitor C1 2103 positioned above VSS 1908 and the gate of output driver transistor 2014. The drain of output transistor 2024 is connected-through column select transistor CS 2105 connecting further into supply voltage VBB through load MOSFET VLP 2107. The MOSFET series-connected string 2104, 2105, 2107 comprise a gain amplifier with output V OUT S 2119 providing V OUT S signal for off-pixel readout signal conditioning circuitry. The MOSFET series-connected string 2111, 2110, 2109, and 2120 provides V OUT R signal for off-pixel readout signal conditioning circuitry. In this embodiment, the CDS gain amplifiers are powered through supply level VBB and reference ground VSS 2121 and VLP 2112 shown.

The pixel imaging signal from incident radiation is sampled into V OUT S 2119 after an image acquisition interval and the charge accumulated into the CCD floating diffusion is transferred into the output SL node charge well of FIGS. 19, 20A, 20B. The pixel reference signal is sampled into V OUT R at the beginning of an image acquisition interval wherein the output node SL is set to voltage level VDD.

This correlated double sampling of the signal level S' directly sensed from the floating diffusion of the CCD string reduces the effects of thermal kTC noise within the sampling interval between SHS and SHR sampling events. MOSFET 2102 provides a means for shorting across sample and hold capacitors within the CDS simultaneously, and therein providing a means for sensing fixed pattern noise.

The correlated double sampling (CDS) circuit of FIG. 21 is prior art disclosed in E. R. Fossum et al, U.S. Pat. No. 5,471,515 issued Nov. 28, 1995.

In embodiments, pixel and photonic imaging arrays comprising the pixel are fabricated using an industry standard CMOS process, so that all of the dopant concentrations of the N-MOSFET and P-MOSFET transistors are in accordance with state of art processes.

Pixel Disposed in Array Applications

Figure 22:
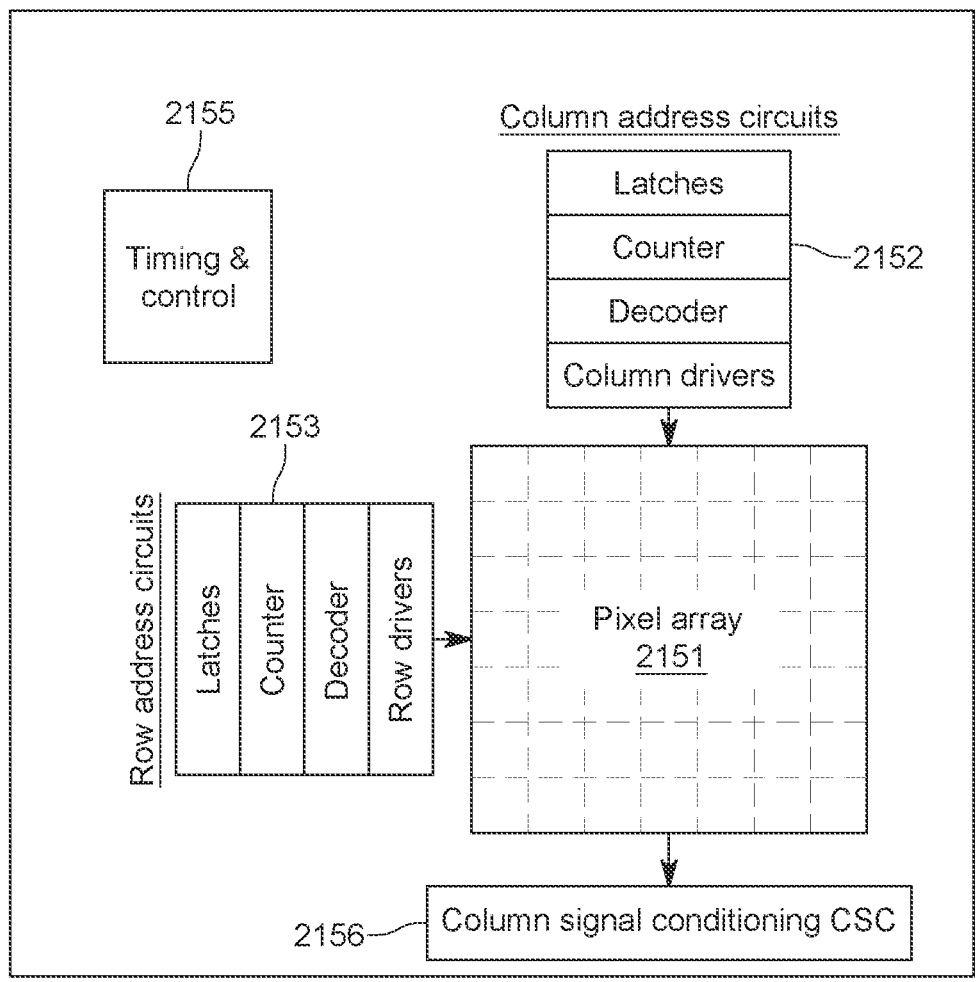
FIG. 22 depicts a prior-art imager.

FIG. 22 depicts a prior art array of pixels 2151 with column address circuits 2152, row address circuits 2153, column signal conditioning (CSC) circuits 2156, and timing and control circuits 2155. In this illustrative embodiment, individual rows of pixels are addressed. Columns of pixels are addressed and readout individually. In embodiments, entire rows, columns, groups of pixels or individual pixels are addressed and readout into the signal conditioning circuit.

Figure 23:
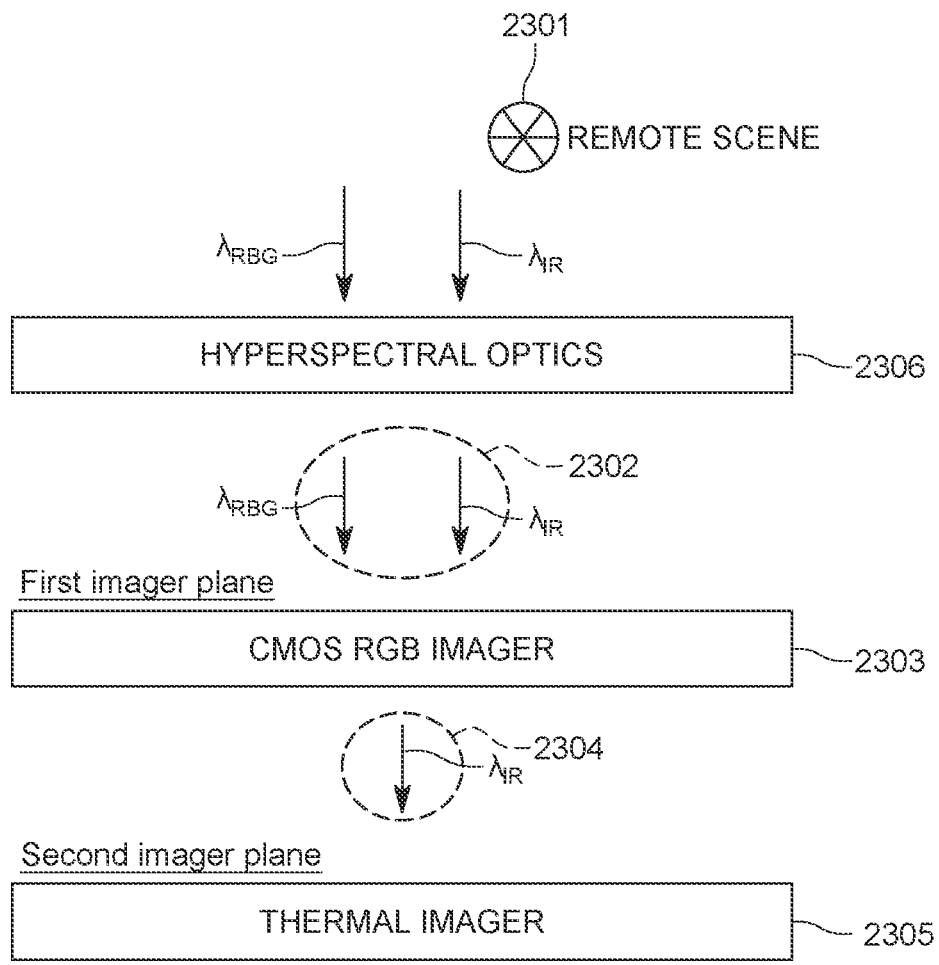
FIG. 23 depicts a hyperspectral imager, the imager comprised of a prior art CMOS RGB imager disposed in a first imager plane and a second imager plane comprising an array of PEIP pixels disposed in a second imager plane, wherein the second imager plane is illuminated with a remotely-sourced infrared image of limited optical bandwidth filtered through the first imager plane, providing a handheld hyperspectral imager.

FIG. 23 depicts a hyperspectral systems embodiment comprising a multi-plane hyperspectral imager wherein a first imager plane 2303 provides an image within the RGB visible wavelength range and a second imager plane 2305 provides an image within the NIR-MM wavelength range. In this embodiment, a remote scene comprising spectral components ARGB and AIR is focused with hyperspectral optics 2306 transparent to the entire wavelength range of interest. The hyperspectral optics 2306 is designed to provide with an extended depth of focus adequate to support imaging resolutions adequate for the first and second sensor planes. The hyperspectral imager can be adapted to include imaging optics and a display screen to provide a hyperspectral image intensifier. In embodiments, the first imager plane comprises a higher pixel density compared with the second imager plane.

The image comprising hyperspectral spectral components ARGB, AIR 2302 is incident into the first sensor plane 2303 wherein an RGB image is created. The RGB image plane is sufficiently transparent to AIR 2304 permitting the second imager to create an infrared image. A remote scene 2301 is also illustrated.

In embodiments, the pixel is adapted into an array format with optics and a raster display. In these embodiments, the adaptation provides an image intensifier.

While the invention has been described in detail by specific reference to preferred embodiments, it is understood that variations and modifications may be made without departing from the true spirit and scope of the invention. It is to be understood that although the disclosure teaches many examples of embodiments in accordance with the present teachings, many additional variations of the invention can easily be devised by those skilled in the art after reading this disclosure. As a consequence, the scope of the present invention is to be determined by the following claims.

What is claimed is:

1. A phononically-enhanced imager pixel (PEIP) disposed on an imaging plane, providing sensitivity to one or more wavelength bands of incident radiation within the wavelength range RGB to millimeter wavelength range, the PEIP comprising:
   a surrounding first substrate having a cavity;
   a plurality of nanowires, wherein the nanowires are physically coupled to a micro-platform and the surrounding substrate, the nanowires thereby suspending the platform in the cavity, wherein, at least a portion of a photonic sensing structure is disposed in the micro-platform;
   the photonic sensing structure comprises a semiconductor device providing one or more of an output signal in response to the incident radiation and a photonic absorbing structure disposed in the micro-platform; and
   one or more of the plurality of nanowires comprise a crystalline semiconductor phononic layer, wherein the said phononic layer comprises resonant or nonresonant phononic structure providing a reduced thermal conductivity between the surrounding substrate and the micro-platform and structural sites physically separated by less than the mean-free-path of heat conducting phonons, and wherein the said phononic structure increases the ratio of electrical conductivity to thermal conductivity within the phononic layer, and wherein the PEIP is structured for operation as a standalone pixel or disposed within an array of pixels wherein external circuitry provides addressing and conditioning of the output signal.

2. The PEIP of claim 1, wherein the photonic sensing structure is a Seebeck thermoelectric (ST) sensor comprised of a thin film semiconductor thermoelectric couple, further comprising, without limitation, one or more of materials Si, Ge, SiGe, InSb, BiSe, BiTe and metals Al, Cu, Ti, Mo, W, Au, and Pt.

3. The PEIP of claim 1, wherein the photonic sensing structure is a bolometer thermister (BT) sensor comprising thin film structure comprising, without limitation, one or more of materials from the group Si, Ge, SiGe, InGaAs, GaAlAs, InSb, and a polytype of vanadium oxide.

4. The PEIP of claim 1, wherein the wherein the photonic sensing structure is a pyro-electric (PE) sensor comprising, without limitation, LiTaO3, CsN3, GaN, and tourmaline.

5. The PEIP of claim 1, wherein the photonic sensing structure comprises one or more photodiodes (PD) providing sensitivity for incident radiation within the wavelength range red, blue, and green (RBG).

6. The PEIP of claim 5, wherein the photonic subpixel comprises a CMOS photogate (PG) sensor sensitive to incident absorbed radiation.

7. The PEIP of claim 1, wherein the photonic sensing structure is a photodiode (PD) sensor or phototransistor (PT) comprised of, without limitation, a monojunction diode, a heterojunction type II semiconductor superlattice.

8. The PEIP of claim 1 comprising a correlated double sampling (CDS) circuit connected to the infrared sensing structure providing a reduction of fixed pattern noise and 1/f noise within a limited sampling circuit bandwidth.

9. The PEIP of claim 8 providing a means for shorting across sample and hold capacitors within the CDS simultaneously, therein providing a means for sensing fixed pattern noise.

10. The PEIP of claim 1, wherein the photonic absorbing structure is resonant within one or more wavelength bands, comprising one or more, without limitation, split ring resonators, LC inductive-capacitive resonators, electromagnetic THz antenna elements, and metamaterial resonators, providing an increase in absorption over a limited wavelength range.

11. The PEIP of claim 1, wherein the photonic absorbing structure comprises, without limitation, one or more of a field of nanotubes including carbon nanotubes, graphene, TiW, TiN, polycrystalline semiconductor particles, gold black, silicon black and a field of structured pillars enhancing absorption of the incident radiation over a broadband wavelength range.

12. The PEIP of claim 1, wherein the phononic layer comprises a structured array of holes pillars, or indentations disposed in a periodic format providing a phononic crystal characterized by a phononic bandgap.

13. The PEIP of claim 1, wherein the phononic layer comprises scattering sites disposed in a random fashion in the surface, in the bulk, or in the edge of said nanowires.

14. The PEIP of claim 1, wherein the phononic layer comprises one of more of holes, vias, surface pillars, surface dots, plugs, cavities, indentations, surface particulates, roughened edges, implanted molecular species and molecular aggregates, the phononic structure disposed in a periodic or random format.

15. The PEIP sensor of claim 14, wherein the second substrate provides an optically transparent window comprised of, without limitation, one or more of Ge, Si, SiGe, ZnSe, CaF2, BaF2, MgF2, GaAs, KBr and glass.

16. The PEIP of claim 1 in embodiments, wherein said one or more of the plurality of nanowires comprising a crystalline semiconductor phononic layer further comprises a second layer, the second layer comprising an ALD metal film providing increased electrical conductivity.

17. The PEIP of claim 1 in embodiments, wherein said one or more of the plurality of nanowires comprising a crystalline semiconductor phononic layer further comprises a third layer, the third layer comprising a dielectric material, without limitation, silicon dioxide, silicon nitride, hafnium oxide, silicon oxynitride, aluminum oxide, PMMA, and SU-8 providing electrical isolation and/or control of mechanical stress.

18. The PEIP of claim 1, wherein a second substrate is bonded to said first substrate providing a hermetic seal for the cavity, further wherein the cavity is maintained in an environment comprising a vacuum or gas of low thermal conductivity.

19. The PEIP of claim 1, wherein the incident infrared radiation is absorbed into the micro-platform through a topside surface or a bottomside surface.

20. The PEIP sensor of claim 1, wherein one or more of the plurality of nanowires and the micro-platform are formed from the same active layer of a starting silicon SOI wafer.

21. The PEIP of claim 1 adapted wherein the micro-platform comprises a Peltier thermoelectric (PTE) cooler powered through one of said plurality of nanowires.

22. The PEIP of claim 1, wherein the micro-platform is spontaneously self-cooled by blackbody radiation emitted from the micro-platform.

23. The PEIP of claim 1, wherein a metallic film disposed directly onto a surface of the cavity provides an exposed surface of low emissivity or absorptivity.

24. The PEIP of claim 1 adapted wherein the micro-platform comprises a resistive heater and a gettering material, thereby providing a means gettering gas in the cavity.

25. The PEIP of claim 1 adapted wherein the pixel cavity comprises multiple micro-platforms, each micro-platform or group of micro-platforms is addressable through intrapixel or interpixel row and column address circuitry to provide an imager.

26. The PEIP of claim 25 disposed within an imager adapted to include imaging optics and a display screen to provide a hyperspectral image intensifier.

27. The PEIP of claim 1 comprising subpixels of types sensitive to different wavelength bands providing a hyperspectral imager.

* * * * *